US010986759B2

(12) United States Patent
Schloo

(10) Patent No.: US 10,986,759 B2
(45) Date of Patent: Apr. 20, 2021

(54) POWER CONVERSION SYSTEMS AND DEVICES, METHODS OF FORMING POWER CONVERSION SYSTEMS AND DEVICES, AND METHODS OF USING AND MONITORING POWER CONVERSION SYSTEMS AND DEVICES

(71) Applicant: Jonathan Schloo, Toronto (CA)

(72) Inventor: Jonathan Schloo, Toronto (CA)

( * ) Notice: Subject to any disclaimer, the term of this patent is extended or adjusted under 35 U.S.C. 154(b) by 0 days.

(21) Appl. No.: 15/781,298

(22) PCT Filed: Dec. 5, 2016

(86) PCT No.: PCT/CA2016/000301
§ 371 (c)(1),
(2) Date: Jun. 4, 2018

(87) PCT Pub. No.: WO2017/091886
PCT Pub. Date: Jun. 8, 2017

(65) Prior Publication Data
US 2018/0359883 A1 Dec. 13, 2018

Related U.S. Application Data

(60) Provisional application No. 62/262,606, filed on Dec. 3, 2015, provisional application No. 62/429,598, filed on Dec. 2, 2016.

(51) Int. Cl.
*H05K 7/20* (2006.01)
*H02M 7/49* (2007.01)

(52) U.S. Cl.
CPC ......... *H05K 7/20918* (2013.01); *H02M 7/49* (2013.01)

(58) Field of Classification Search
CPC ............................ H02M 7/49; H05K 7/20918
See application file for complete search history.

(56) References Cited

U.S. PATENT DOCUMENTS 4,946,096 A * 8/1990 Ballard .................. F23N 5/265
                                                                                  236/11
6,455,954 B1 * 9/2002 Dailey .................... H02J 9/062
                                                                                  307/43

(Continued)

*Primary Examiner* — William H. Mayo, III
*Assistant Examiner* — Rhadames Alonzo Miller
(74) *Attorney, Agent, or Firm* — Fasken Martineau DuMoulin LLP

(57) ABSTRACT

Embodiments relate generally to power conversion systems. The system may include an inverter subsystem, inverter housing assembly, and processing subsystem. The inverter subsystem may include an input section for receiving input DC voltage and output section for providing output AC voltage. The inverter housing assembly may include side walls, main cavity, air inflow section, and air outflow section. The main cavity may be formed so as to house the inverter subsystem and form a ventilation channel. The air inflow section may be for use in allowing an inflow of air. The air outflow section may be for use in allowing an outflow of air. The processing subsystem may include a monitoring assembly and communication assembly. Monitoring assembly may be electrically connected to the inverter subsystem and configurable to perform measurements. Communication assembly may be in communication with the monitoring assembly, and configurable to communicate measurements performed by the monitoring assembly.

16 Claims, 8 Drawing Sheets

(56) References Cited

U.S. PATENT DOCUMENTS

| | | | | |
|---|---|---|---|---|
| 2006/0171115 A1* | 8/2006 | Cramer | ................ | H02M 7/003 |
| | | | | 361/695 |
| 2008/0266913 A1* | 10/2008 | Brotto | ................... | H02J 7/0042 |
| | | | | 363/60 |
| 2010/0302728 A1* | 12/2010 | Knaup | ............... | H05K 7/20918 |
| | | | | 361/690 |
| 2011/0069451 A1* | 3/2011 | Hobein | ................ | H02M 7/003 |
| | | | | 361/695 |
| 2011/0090726 A1* | 4/2011 | Brotto | ................... | H02J 7/0065 |
| | | | | 363/131 |
| 2011/0214897 A1* | 9/2011 | Yoshida | ................ | H05K 5/063 |
| | | | | 174/50.51 |
| 2012/0250254 A1* | 10/2012 | Kojyo | ................ | H05K 7/20918 |
| | | | | 361/692 |
| 2012/0261100 A1* | 10/2012 | Aoki | ................. | H05K 7/20918 |
| | | | | 165/104.34 |
| 2013/0343110 A1* | 12/2013 | Liu | ................... | H05K 7/20909 |
| | | | | 363/141 |
| 2015/0296653 A1* | 10/2015 | Mathieu | ............ | H05K 7/20918 |
| | | | | 361/690 |
| 2015/0342087 A1* | 11/2015 | Donth | ................ | H05K 7/20918 |
| | | | | 361/695 |
| 2015/0373869 A1* | 12/2015 | Macerini | ............. | H05K 5/0213 |
| | | | | 361/704 |
| 2015/0373870 A1* | 12/2015 | Lee | ................... | H05K 7/20918 |
| | | | | 361/709 |
| 2016/0037677 A1* | 2/2016 | Yamanaka | ........ | H05K 7/20918 |
| | | | | 361/697 |
| 2016/0332524 A1* | 11/2016 | Yoon | ....................... | H02M 7/44 |
| 2017/0288565 A1* | 10/2017 | Bethke | ................ | H05K 7/1432 |
| 2018/0184542 A1* | 6/2018 | Aitzetmueller | ...... | H05K 7/1432 |
| 2018/0279504 A1* | 9/2018 | Yoshikawa | ........ | H05K 7/20154 |

* cited by examiner

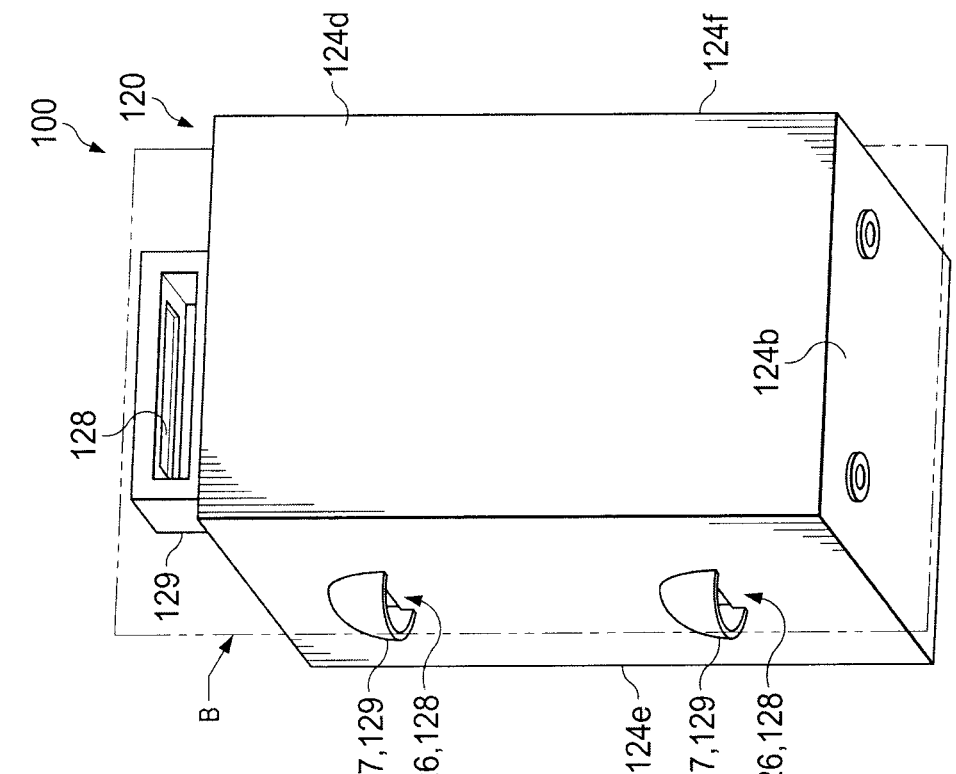
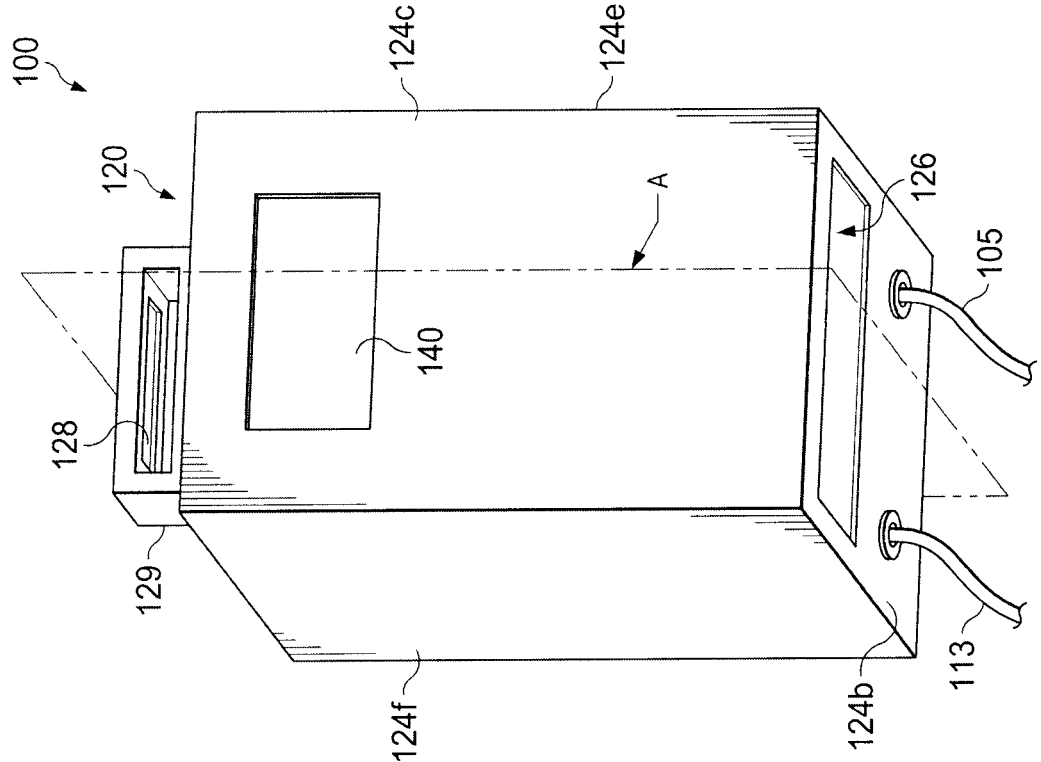
FIG. 1A
FIG. 1B

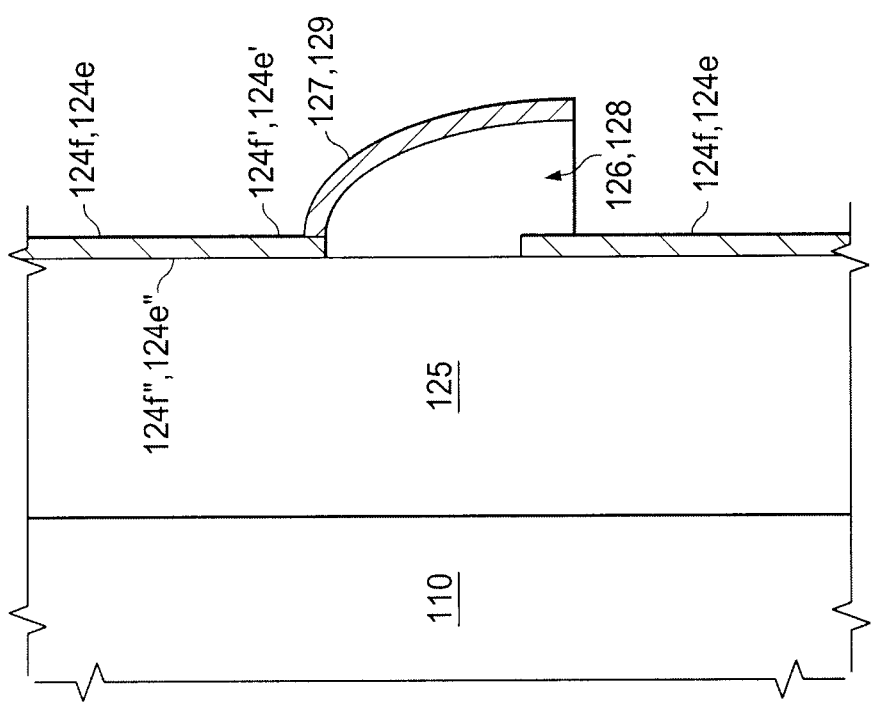
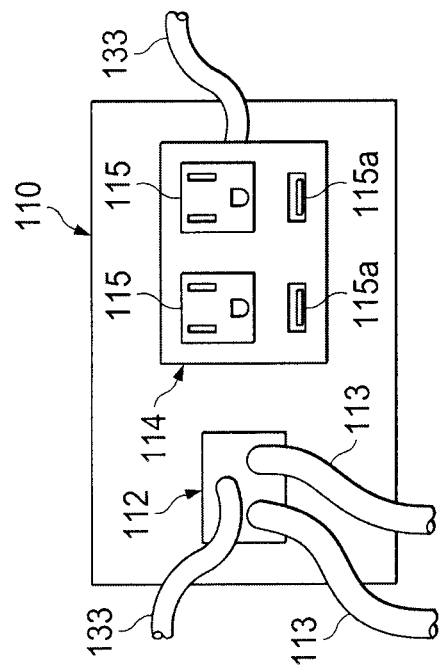
FIG. 1F
FIG. 1E

POWER CONVERSION SYSTEMS AND DEVICES, METHODS OF FORMING POWER CONVERSION SYSTEMS AND DEVICES, AND METHODS OF USING AND MONITORING POWER CONVERSION SYSTEMS AND DEVICES

TECHNICAL FIELD

The present disclosure relates generally to power conversion systems and devices, and more specifically, the present disclosure relates generally to power conversion systems and devices, inverter systems, methods of forming power conversion systems and devices, and methods of using and/or monitoring power conversion systems and devices.

BACKGROUND

There are a variety of power conversion systems and devices available and in use today. Inverters, for example, are available to convert direct current (DC) power from a DC power source to alternating current (AC) power. Inverters are generally available as an integrated unit having an external metal casing, or the like, one or more power cables connectable or permanently connected to the inverter, and one or more electrical outlets. In respect to the power cables, such cables are used to connect to and receive DC power from a DC power source. In respect to the electrical outlets, which may vary in configuration depending on, among other things, country and/or region, an electrical outlet may be provided on an exterior side of the inverter to receive an electrical plug of an electrical device. When in safe, controlled, and sufficiently dry operation (i.e., not exposed to liquid), inverters may be operable to supply AC power to electrical devices.

BRIEF SUMMARY

Situations may arise when there is a need to use one or more electrical devices, but an AC power source is not available or accessible. Example situations may include, but are not limited to, power/electrical outages; disabled, malfunctioning, and/or non-functioning elements (e.g., a transformer, inverter, etc.) of a public or private utility company used in the distribution of electricity; and outdoor situations and/or locations, including those locations without AC power source and those situations pertaining to non-ideal surroundings or environmental conditions.

It is recognized in the present disclosure that such situations will result in users being unable to use one or more of their electrical devices.

Present example embodiments relate generally to and/or comprise systems, subsystems, devices, assemblies, and methods for addressing conventional problems, including those described above and in the present disclosure, and more specifically, example embodiments relate to power conversion systems and devices, including methods of forming such systems and devices and methods of using such systems and devices.

In an exemplary embodiment, a power conversion system is described. The power conversion system may include an inverter subsystem and an inverter housing assembly. The inverter subsystem may include an input section for receiving an input DC voltage and an output section for providing an output AC voltage based on the input DC voltage received by the input section. The inverter housing assembly may include a plurality of side walls, a main cavity, an air inflow section, and an air outflow section. The main cavity may be formed by at least some of the plurality of side walls. The main cavity may be formed in such a way as to house the inverter subsystem and form a ventilation channel. The air inflow section may be operable for use in allowing an inflow of air into at least the ventilation channel. The air outflow section may be operable for use in allowing an outflow of air from at least the ventilation channel. The air inflow section and air outflow section may be formed in such a way that, when the inverter housing assembly is positioned so that an outwardly facing surface of a top side wall of the inverter housing assembly faces substantially upwards, the inverter housing assembly is operable to prevent a downfall of rain, snow, and/or other naturally falling liquids from entering into the main cavity and/or flowing onto the inverter subsystem.

In another exemplary embodiment, a power conversion system is described. The power conversion system may include an inverter subsystem, an inverter housing assembly, and a processing subsystem. The inverter subsystem may include an input section for receiving an input DC voltage and an output section for providing an output AC voltage based on the input DC voltage received by the input section. The inverter housing assembly may include a plurality of side walls, a main cavity, an air inflow section, and an air outflow section. The main cavity may be formed by at least some of the plurality of side walls. The main cavity may be formed in such a way as to house the inverter subsystem and form a ventilation channel. The air inflow section may be operable for use in allowing an inflow of air into at least the ventilation channel. The air outflow section may be operable for use in allowing an outflow of air from at least the ventilation channel. The processing subsystem may include a monitoring assembly and a communication assembly. The monitoring assembly may be electrically connected to the inverter subsystem. The monitoring assembly may be configurable to perform one or more measurements, including at least a measurement of the input DC voltage at the input section. The communication assembly may be in communication with the monitoring assembly. The communication assembly may be configurable to communicate one or more measurements performed by the monitoring assembly. For example, such one or more measurements may be communicated, directly or indirectly, to one or more computing devices, one or more electrical devices, one or more other power conversion systems, one or more networks, one or more databases, and the like.

In another exemplary embodiment, a method of forming a portable power conversion system is described. The portable power conversion system may be operable to provide and/or remotely monitor the providing of AC power to one or more electrical devices via a power source. The power source may be a battery installed in a vehicle. The method may include providing an inverter. The inverter may include an input section for receiving an input DC voltage and an output section for providing an output AC voltage based on the input DC voltage received by the input section. The method may further include forming an inverter housing assembly. The inverter housing assembly may be formed in such a way as to include a plurality of side walls and a main cavity formed by at least some of the plurality of side walls. The main cavity may be formed in such a way as to enable the main cavity to house the inverter and form a ventilation channel. The inverter housing assembly may further be formed in such a way as to include an air inflow section. The air inflow section may be operable for use in allowing an inflow of air into at least the ventilation channel. The inverter housing assembly may further be formed in such a way as to include an air outflow section. The air outflow section may be operable for use in allowing an outflow of air from at least the ventilation channel. The method may further include securing the inverter in the main cavity of the inverter housing assembly. The method may further include providing a monitoring assembly. The method may further include electrically connecting the monitoring assembly to the inverter. The method may further include configuring the monitoring assembly to perform one or more measurements. The one or more measurements may include a measurement of the input DC voltage at the input section. The method may further include providing a communication assembly. The method may further include forming a communication channel between the communication assembly and the monitoring assembly so as to receive, at the communication assembly from the monitoring assembly, one or more measurements performed by the monitoring assembly. The method may also include configuring the communication assembly to communicate, to a computing device having an established communication channel with the communication assembly, one or more measurements performed by the monitoring assembly.

In another exemplary embodiment, a method of providing and remotely monitoring the providing of emergency AC power to one or more AC powered electrical devices via a power source is described. The power source may include a battery installed in a vehicle. The method may include providing a portable power conversion system. The portable power conversion system may include an inverter subsystem, an inverter housing assembly for housing the inverter subsystem, and a processing subsystem. The inverter subsystem may include an input section for receiving an input DC voltage from the battery and an output section for providing an output AC voltage to the one or more AC powered electrical devices based on the input DC voltage received by the input section. The inverter housing assembly may include a plurality of side walls and a main cavity formed by at least some of the plurality of side walls. The main cavity may be formed in such a way as to house the inverter subsystem and form a ventilation channel. The inverter housing assembly may also include an air inflow section. The air inflow section may be operable for use in allowing an inflow of air into at least the ventilation channel. The inverter housing assembly may further include an air outflow section. The air outflow section may be operable for use in allowing an outflow of air from at least the ventilation channel. The processing subsystem may include a monitoring assembly configurable to perform one or more measurements. The measurements may include a measurement of the input DC voltage provided by the battery at the input section. The processing subsystem may further include a communication assembly configurable to communicate, to the computing device, one or more measurements performed by the monitoring assembly. The method may further include configuring the computing device to receive, from the communication assembly, information. The information may include one or more measurements performed by the monitoring assembly.

BRIEF DESCRIPTION OF THE DRAWINGS

For a more complete understanding of the present disclosure, example embodiments, and their advantages, reference is now made to the following description taken in conjunction with the accompanying drawings, in which like reference numbers indicate like features, and:

FIG. 1A is a perspective view of an example embodiment of a power conversion system with an air inflow section provided at a lower portion of the inverter housing assembly;

FIG. 1B is a perspective view of an embodiment of a power conversion system with an air inflow section provided at a lower portion of a side wall of the inverter housing assembly;

FIG. 1E is a cross-sectional view along a plane parallel to plane B (as illustrated in FIG. 1B) of an example embodiment of an inverter housing assembly having an air inflow section and/or air outflow section;

FIG. 1F is a side view of an example embodiment of an inverter subsystem having an input section and an output section;

Although similar reference numbers may be used to refer to similar elements in the figures for convenience, it can be appreciated that each of the various example embodiments may be considered to be distinct variations.

Figure 1C:
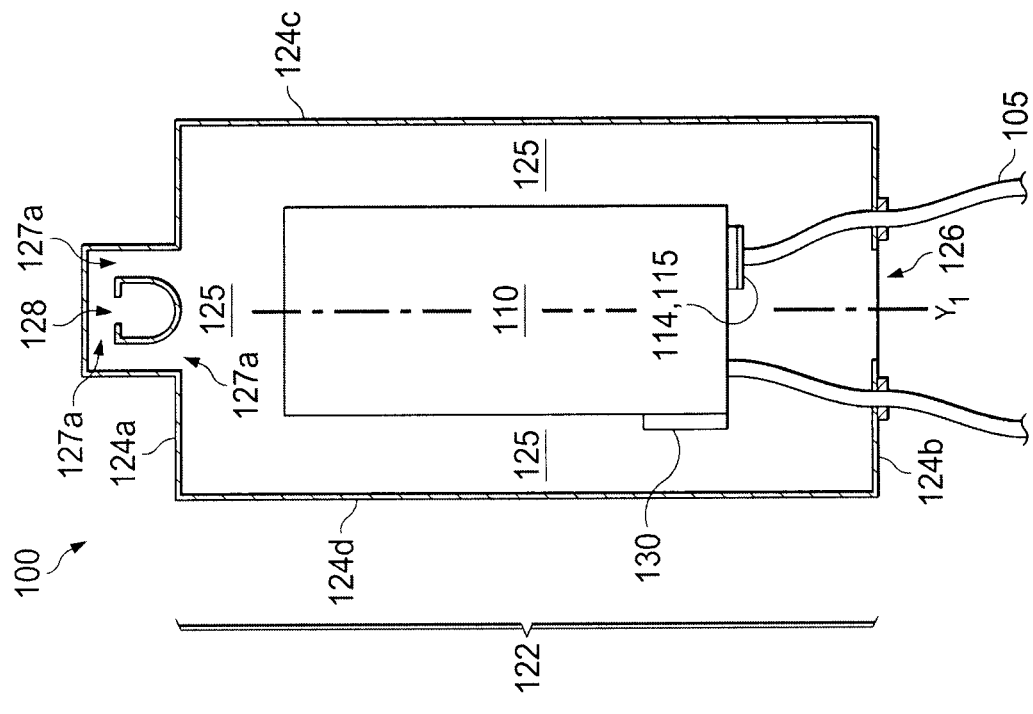
FIG. 1C is a cross-sectional view along a plane parallel to plane A (as illustrated in FIG. 1A) of an example embodiment of a power conversion system having an inverter subsystem provided on the rear side wall.

Example embodiments will now be described with reference to the accompanying drawings, which form a part of the present disclosure and which illustrate example embodiments which may be practiced. As used in the present disclosure and the appended claims, the terms "example embodiment," "exemplary embodiment," and "embodiment," do not necessarily refer to a single embodiment, although they may, and various example embodiments may be readily combined and/or interchanged without departing from the scope or spirit of example embodiments. Furthermore, the terminology as used in the present disclosure and the appended claims is for the purpose of describing example embodiments only and is not intended to be limitations. In this respect, as used in the present disclosure and the appended claims, the term "in" may include "in" and "on," and the terms "a," "an," and "the" may include singular and plural references. Furthermore, as used in the present disclosure and the appended claims, the term "by" may also mean "from," depending on the context. Furthermore, as used in the present disclosure and the appended claims, the term "if" may also mean "when" or "upon," depending on the context. Furthermore, as used in the present disclosure and the appended claims, the words "and/or" may refer to and encompass any and all possible combinations of one or more of the associated listed items.

DETAILED DESCRIPTION

Common everyday electrical devices (or electronic devices, hereinafter "electrical devices") will generally require alternating current (AC) power in order to operate and/or charge (e.g., for rechargeable electrical devices and/or batteries used to power electrical devices). Examples of electrical devices include, but are not limited to, smart and traditional electrical appliances (e.g., fridges, freezers, stoves, ovens, microwaves, blenders, toasters, coffee makers, hot water boilers, etc.), heaters, furnaces, air conditioners, fans, humidifiers, dehumidifiers, air purifiers, lamps and other lighting sources, computing devices (e.g., desktop computers, monitors, laptop computers, notebooks, mobile computing devices, hard disk drives, solid state drives, media players, scanners, etc.), televisions, projectors, cable boxes, receivers, amplifiers, speakers, modems, Wi-Fi routers, telephones, facsimiles, photocopiers, CCTV systems, home alarm and/or monitoring systems, automated garage doors, automated gates and doors, snow blowers, electric vehicles, hair dryers and curlers, electric shavers and toothbrushes, and smart versions of one or more of the aforementioned electrical devices, etc. Examples of smart versions of electrical devices include, but are not limited to, those electrical devices having any form of communication capability (e.g., internet, Wi-Fi, Bluetooth, NFC, RF, IoT capability, etc.), functionalities to control one or more aspects or functions of itself and/or other electrical devices, and functionalities to have one or more aspects or functions of itself and/or other electrical devices remotely controlled. Depending on the country and/or region, AC power will generally be available between about 100-240 VAC.

Situations may arise, however, when there is a need to use and/or have operational one or more electrical devices, but there is little or no AC power available. Example situations may include, but are not limited to, power/electrical outages due to an electricity supply and/or distribution failure by a local, national, public, and/or private electricity supply or distribution company (e.g., Hydro One, Toronto Hydro-Electric System Limited, etc.); a cut, disconnected, malfunctioning, and/or non-functioning electrical/power cable or connector; a disabled, malfunctioning, and/or non-functioning electrical element (e.g., a transformer, inverter, etc.) used for the distribution of electricity to a particular residential home, building, street, area, neighborhood, municipality, city, province/state, etc.; an over-use or peak in electricity usage; and outdoor situations and/or locations, including those locations with little or no available and/or accessible AC power source (e.g., in a driveway of a residential home, field, park, parking lot, street, public area). Such problems may be compounded, however, when such required or needed use or operation of electrical devices occur in, during, or under undesirable or severe environmental conditions, such as rain, snow, hail, etc.

It is recognized in the present disclosure that certain situations and/or locations, including those described above and in the present disclosure, will result in users being unable to use one or more of their electrical devices.

Present example embodiments relate generally to and/or comprise systems, subsystems, devices, assemblies, and methods for addressing such conventional problems, including those described above and in the present disclosure, and more specifically, example embodiments relate to power conversion systems and devices, including methods of forming such systems and devices and methods of using such systems and devices, that enable users to supply their electrical devices with AC power. It is to be understood in the present disclosure that the terms "power conversion system," "power conversion device," "inverter," "inverter system," "inverter subsystem," "inverter device," "inverter assembly," and/or the like, may be interchangeably used to refer to various example embodiments. These example embodiments will now be described below with reference to the accompanying figures, which form a part of the present disclosure.

Example Embodiments of a Power Conversion System (e.g., Power Conversion System 100).

As an overview, an example embodiment of a power conversion system (e.g., power conversion system 100) may include an inverter subsystem (e.g., inverter subsystem 110, as illustrated in at least FIGS. 1C, 1D, 1F, and 1G). The power conversion system (e.g., power conversion system 100) may include an inverter housing assembly (e.g., inverter housing assembly 120, as illustrated in at least FIGS. 1A-E). The power conversion system (e.g., power conversion system 100) may include a processing subsystem (e.g., processing subsystem 130, as illustrated in at least FIG. 1H). The power conversion system (e.g., power conversion system 100) may include an indicator subsystem (e.g., indicator subsystem 140, as illustrated in at least FIG. 1A). The power conversion system (e.g., power conversion system 100) may include and/or be in data communications with one or more computing devices (e.g., computing device 150, as illustrated in at least FIG. 2). The power conversion system (e.g., power conversion system 100) may include and/or be in electrical communications with one or more DC power sources (e.g., battery 102, as illustrated in at least FIGS. 3A-B). The power conversion system (e.g., power conversion system 100) may include and/or be in electrical and/or data communications with one or more electrical devices (e.g., electrical device 104, as illustrated in at least FIGS. 3A-B). The power conversion system (e.g., power conversion system 100) may include and/or be in data communication with one or more networks (e.g., network 170, as illustrated in at least FIG. 2). The power conversion system (e.g., power conversion system 100) may include and/or be in data communication with one or more databases (e.g., database 160, as illustrated in at least FIG. 2). The power conversion system (e.g., power conversion system 100) may include and/or be in electrical and/or data communication with an activation controller (not shown in the figures).

Example embodiments of the power conversion system (e.g., power conversion system 100) may include or not include one or more of the above and below elements, may include additional elements, may be formed and/or used in different sequences, combinations, and/or configurations, and/or one or more of the elements (and/or elements of elements) may be combinable into a single element or divided into two or more elements. Inverters other than pure sine wave inverters and power supplies other than batteries installed/operating in vehicles are also contemplated in example embodiments without departing from the teachings of the present disclosure. These power conversion systems (e.g., power conversion system 100), and elements thereof, will now be further explained with reference to the accompanying Figures.

Inverter Subsystem (e.g., Inverter Subsystem 110).

As illustrated in at least FIG. 1C, FIG. 1D, FIG. 1F, and FIG. 1G, the power conversion system (e.g., power conversion system 100) may include an inverter subsystem (e.g., inverter subsystem 110).

Figure 1D:
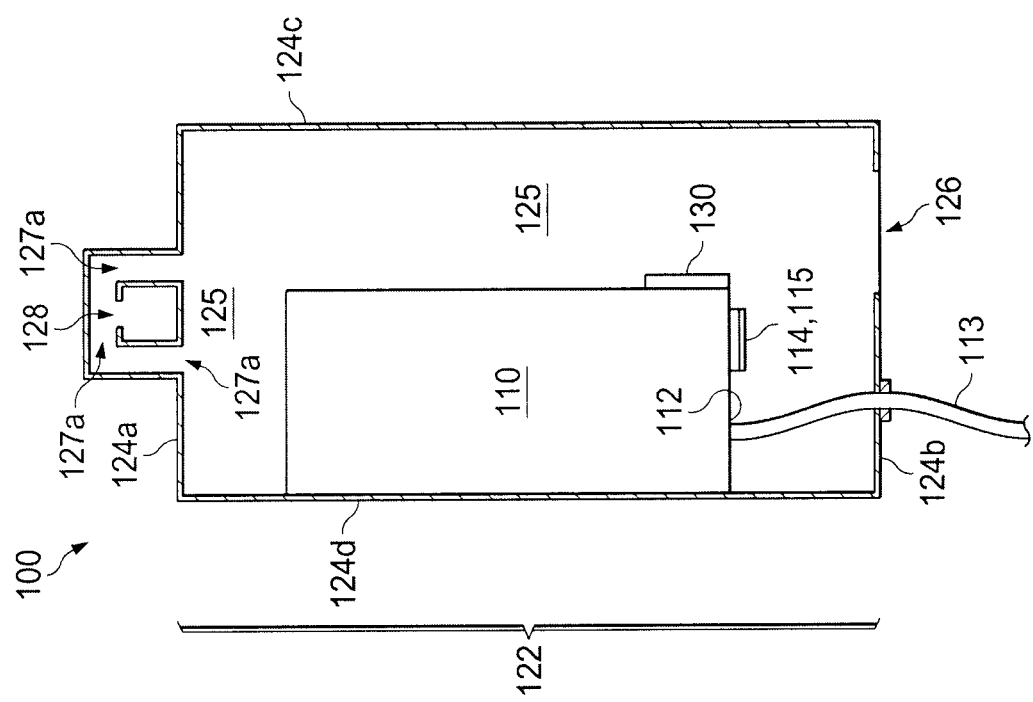
FIG. 1D is a cross-sectional view along a plane parallel to plane A (as illustrated in FIG. 1A) of an example embodiment of a power conversion system having an inverter subsystem not provided on the rear side wall.

For illustration purposes, FIG. 1C represents a cross-sectional view along a plane parallel to plane A (as indicated in FIG. 1A) of an example embodiment of the power conversion system (e.g., power conversion system 100) having the inverter subsystem (e.g., inverter subsystem 110) provided on or secured to a rear side wall 124d. Furthermore, FIG. 1D represents a cross-sectional view along a plane parallel to plane A (as indicated in FIG. 1A) of another example embodiment of the power conversion system (e.g., power conversion system 100) having inverter subsystem (e.g., inverter subsystem 110) not provided on or secured to rear side wall 124d (e.g., provided on left and/or right side wall 124e, 124f). Furthermore, FIGS. 1F-G represents side views of example embodiments of an inverter subsystem (e.g., inverter subsystem 110).

In example embodiments, the inverter subsystem (e.g., inverter subsystem 110) may be configurable to convert direct current (DC) power to alternating current (AC) power. The inverter subsystem (e.g., inverter subsystem 110) may comprise an input section (e.g., input section 112) and an output section (e.g., output section 114).

Figure 3A:
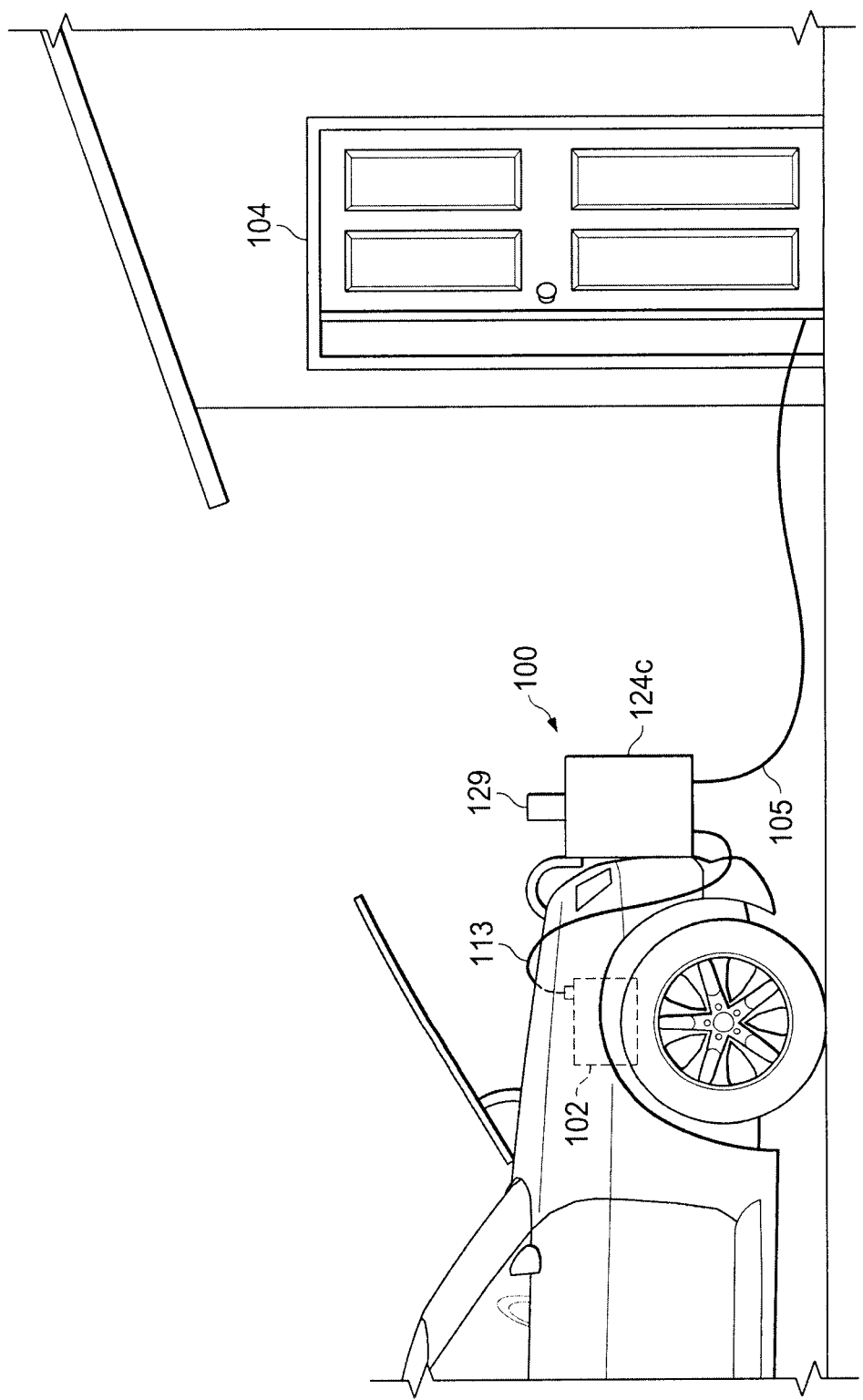
FIG. 3A is an illustration of an application of an example embodiment of a power conversion system.
Figure 3B:
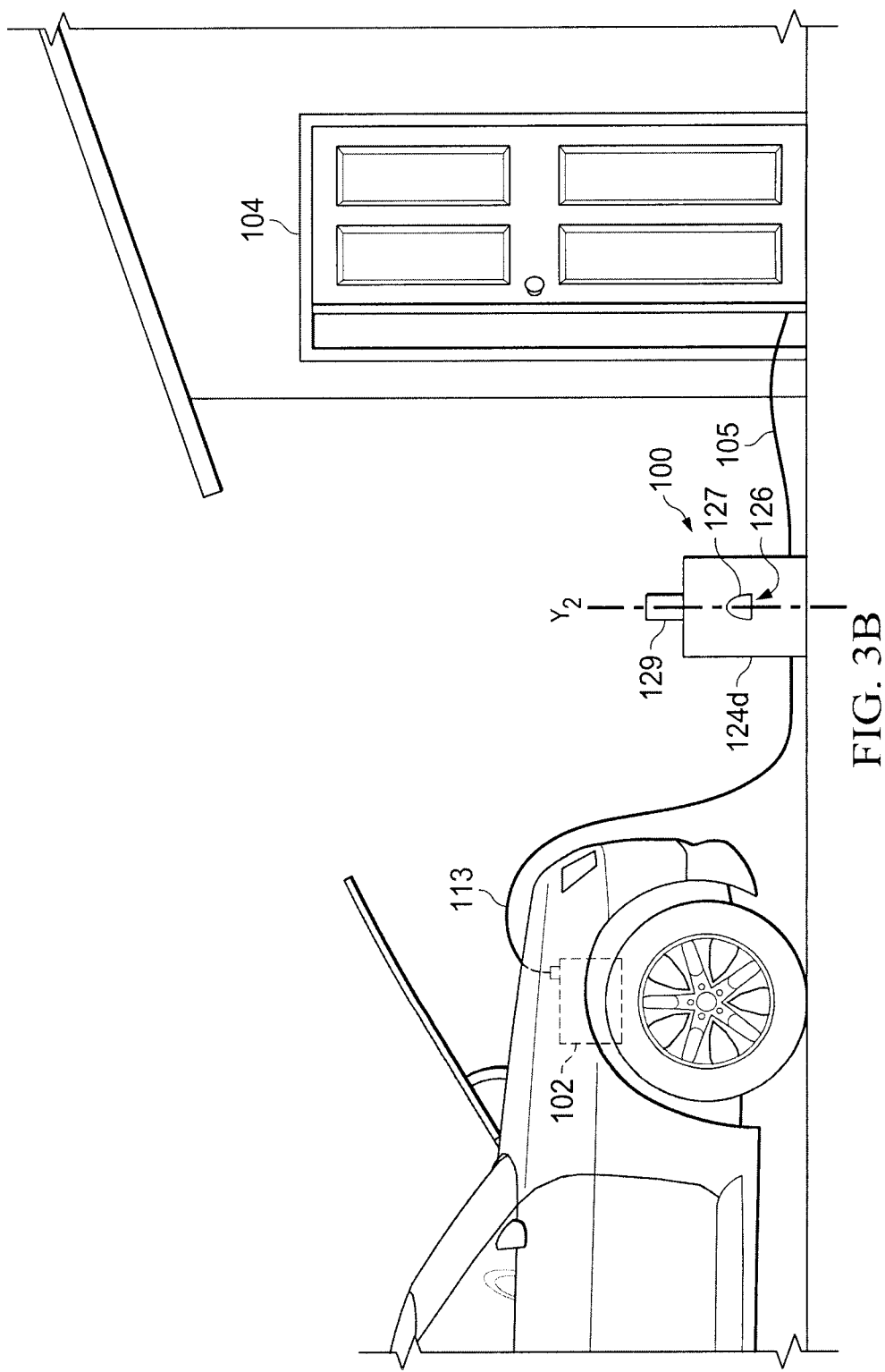
FIG. 3B is an illustration of another application of an example embodiment of a power conversion system.

In an example embodiment, the input section (e.g., input section 112) may be operable to receive, as an input, DC voltage (or DC power or DC current; hereinafter "DC voltage" or "input DC voltage" when referring to power, voltage, or current supplied to the inverter subsystem). For example, the input DC voltage may be provided to the input section (e.g., input section 112) by one or more batteries (e.g., battery 102, as illustrated in FIG. 3A and FIG. 3B), such as those installed and used in one or more vehicles. Non-limiting examples of such vehicles include a car, SUV, truck, cross-over vehicle, minivan, bus, ATV, cart, train, other land-based vehicles, boat, other water-based vehicles, planes, other air-based vehicles, and hybrid and/or electric versions of any of the aforementioned vehicles.

The input section (e.g., input section 112) may include or be in electrical communication with one or more power cables (e.g., power cable 113) to receive such input DC voltage from one or more batteries (e.g., battery 102), as illustrated in at least FIGS. 1A, 1C-D, 1F-G, and 3A-B. Example embodiments of a power cable (e.g., power cable 113) may include a jumper cable, booster cable, etc. having connectors, such as mechanical clamps, clips, or plugs. The power cable (e.g., power cable 113) may be connectable or permanently connected to the input section (e.g., input section 112).

The output section (e.g., output section 114) may be operable to provide, as an output, alternating current (AC) voltage (or AC power or AC current; hereinafter "AC voltage" or "output AC voltage" when referring to power, voltage, or current supplied by the inverter subsystem). For example, the output section (e.g., output section 114) may be operable to provide AC voltage to one or more electrical devices (e.g., electrical devices 104, as illustrated in at least FIGS. 3A-B). The output AC voltage supplied by the output section (e.g., output section 114) may be based on the input DC voltage received by the input section (e.g., input section 112).

The output section (e.g., output section 114) may include or be in electrical communication with an electric or power cable (e.g., power cable 105) to provide such output AC voltage to one or more electrical devices (e.g., electrical device 104), as illustrated in at least FIGS. 1A, 1D, 1G, and 3A-B. Example embodiments of a power cable (e.g., power cable 105) may include a conventional electric cable, jumper cable, booster cable, etc. having a conventional 2-prong or 3-prong electric plug (e.g., plug 115', as illustrated in FIG. 1G and generally used for electrical devices), USB connectors (e.g., USB connector 115a', as illustrated in FIG. 1G), or the like, for use in plugging into traditional electric outlets (e.g., electric outlet 115, as illustrated in FIGS. 1F-G), USB ports (e.g., USB port 115a, as illustrated in FIGS. 1F-G), or the like.

In an example embodiment, the output AC voltage supplied by the output section (e.g., output section 114) may be in the form of a pure sine wave AC voltage. The output AC voltage supplied by the output section (e.g., output section 114) may also be in the form of a modified sine wave AC voltage. The output AC voltage supplied by the output section (e.g., output section 114) may also be selectable in some example embodiments.

Inverter Housing Assembly (e.g., Inverter Housing Assembly 120)

Example embodiments of the power conversion system (e.g., power conversion system 100) may include an inverter housing assembly (e.g., inverter housing assembly 120). The inverter housing assembly (e.g., inverter housing assembly 120) may be formed in or using one or more of a plurality of configurations, shapes, sizes, and/or material compositions.

The inverter housing assembly (e.g., inverter housing assembly 120) may include a plurality of side walls (e.g., side walls 124a-f). As illustrated in at least FIG. 1A, FIG. 1B, and FIGS. 1C-D, the inverter housing assembly (e.g., inverter housing assembly 120) may include one or more of the following side walls: a top side wall 124a, bottom side wall 124b, front side wall 124c, rear side wall 124d, left side wall 124e, and/or right side wall 124f. It is to be understood in the present disclosure that a surface, including an outwardly facing surface and/or an inwardly facing surface, of one or more of the side walls of the inverter housing assembly (e.g., inverter housing assembly 120) may be formed in or using any one or more surface topologies, geometries, textures, and/or features without departing from the teachings of the present disclosure. For example, an outwardly facing surface (and/or inwardly facing surface) of one or more side walls of the inverter housing assembly (e.g., inverter housing assembly 120) may be formed as having, without limitation, a flat surface, curved surface, water-resistant surface, textured surface, smooth surface, non-absorbent surface, reflective surface, rugged surface, and/or a combination of one or more of these or other topologies, geometries, textures, and/or features.

In an example embodiment, the inverter housing assembly (e.g., inverter housing assembly 120) may include a main cavity (e.g., main cavity 122, as illustrated in FIGS. 1C-D, which may include the volume between some or all of the side walls). The main cavity (e.g., main cavity 122) may be formed by at least some of the plurality of side walls. For example, the main cavity (e.g., main cavity 122) may be formed by top side wall 1a, front side wall 1c, rear side wall 1d, left side wall 1e, and right side wall 1f. In such an example embodiment, the main cavity (e.g., main cavity 122) may also be formed by bottom side wall 1b as well if the bottom side wall 1b is provided (as illustrated in FIGS. 1A-D). In certain example embodiments, the bottom side wall 1b may be minimal or may not provided at all so as to provide a larger or maximized air inflow section (e.g., air inflow section 126). Such example embodiments may be operable for use in applications where the power conversion system (e.g., power conversion system 100) is attached to and/or suspended from a vehicle or other structure or object (as illustrated in FIG. 3A). In other example embodiments, the bottom side wall 1b may be mostly or completely sealed so as to cover most or the entire bottom portion of the inverter housing assembly (e.g., inverter housing assembly 120). Such example embodiments may be operable for use in applications where the power conversion system (e.g., power conversion system 100) is placed in operation on a surface (e.g., a floor) (as illustrated in FIG. 3B).

The main cavity (e.g., main cavity 122) may be formed in such a way as to house the inverter subsystem (e.g., inverter subsystem 110) and form a ventilation channel (e.g., ventilation channel 125, as illustrated in at least FIGS. 1C-E). In example embodiments, the ventilation channel (e.g., ventilation channel 125) may be operable for use in allowing a flow of air between the air inflow section (e.g., air inflow section 126) and air outflow section (e.g., air outflow section 128, as illustrated in at least FIGS. 1A-E). For example, the ventilation channel (e.g., ventilation channel 125) may be for use in controlling an operating temperature of the inverter subsystem (e.g., inverter subsystem 110).

In example embodiments, the inverter housing assembly (e.g., inverter housing assembly 120) may include one or more air inflow sections (e.g., air inflow section 126). The inverter housing assembly (e.g., inverter housing assembly 120) may also include one or more air outflow sections (e.g., air outflow section 128). The air inflow section (e.g., air inflow section 126) and air outflow section (e.g., air outflow section 128) may be operable to cooperate (along with the ventilation channel (e.g., ventilation channel 125)) to control an operating temperature of the inverter subsystem (e.g., inverter subsystem 110). These elements of the inverter housing assembly (e.g., inverter housing assembly 120) are further explained below with reference to the accompanying figures.

i. Air Inflow Section (e.g., Air Inflow Section 126).

An example embodiment of the air inflow section (e.g., air inflow section 126) may be for use in allowing an inflow of air into the main cavity (e.g., main cavity 122). For example, the air inflow section (e.g., air inflow section 126) may be for use in allowing an inflow of air into at least the ventilation channel (e.g., ventilation channel 125).

The inverter housing assembly (e.g., inverter housing assembly 120) may include one or more air inflow sections (e.g., air inflow section 126), and such one or more air inflow sections (e.g., air inflow section 126) may be provided in one or more of a plurality of locations on the inverter housing assembly (e.g., inverter housing assembly 120). Furthermore, the one or more air inflow sections (e.g., air inflow section 126) may be formed in one or more of a plurality of configurations, shapes, and/or sizes. For example, the air inflow section (e.g., air inflow section 126) may be provided on the bottom or lower portion of the inverter housing assembly (e.g., inverter housing assembly 120). The lower portion of the inverter housing assembly (e.g., inverter housing assembly 120) may be a portion opposite to the top side wall 124a. As illustrated in FIGS. 1A, 1C, and 1D, the air inflow section (e.g., air inflow section 126) may be provided on the bottom side wall 124b in the form of one opening. The air inflow section (e.g., air inflow section 126) may also be provided on the bottom side wall 124b in the form of a plurality of openings.

The lower portion of the inverter housing assembly (e.g., inverter housing assembly 120) may also be a lower portion of another side wall (such as a lower portion of the left side wall 124e, right side wall 124f, front side wall 124c, and/or rear side wall 124d). For example, as illustrated in FIG. 1B and FIG. 1E, one or more of the air inflow sections (e.g., air inflow section 126) may be provided on a lower portion of the left side wall 124e and/or right side wall 124f.

For illustration purposes, FIG. 1E (when used to illustrate an example embodiment of the air inflow section (e.g., air inflow section 126)) represents a cross-sectional view along a plane parallel to plane B (as indicated in FIG. 1B) of an example embodiment of the inverter housing subsystem (e.g., inverter housing subsystem 120) having an air inflow section (e.g., air inflow section 126) provided on a lower portion of the left side wall 124e and/or right side wall 124f.

In example embodiments, one or more air inflow sections (e.g., air inflow section 126), including those described above and in the present disclosure, may be formed next to, along with, integrated with, and/or by a structure (e.g., structure 127, as illustrated in FIGS. 1B and 1E). The structure (e.g., structure 127) may be a structure that protrudes outwardly from an outwardly facing surface of a side wall, such as the left side wall 124e, right side wall 124f, and/or bottom sidewall 124b. An example outwardly facing surface 124f' or 124e' and example inwardly facing surface 124f" or 124e" are illustrated in FIG. 1E. In an example embodiment, the one or more structures (e.g., structure 127) may include or be formed as a handle (e.g., handle 127). The handle (e.g., handle 127) may be operable for use in portably transporting the portable power conversion system (e.g., power conversion system 100). It is recognized in the present disclosure that such one or more structures (e.g., structure 127) may be operable to prevent liquid, such as a downfall of rain, snow, or other naturally falling liquids, from entering into the inverter housing assembly (e.g., inverter housing assembly 120) and/or flowing onto the inverter subsystem (e.g., inverter subsystem 110). For example, when the inverter housing assembly (e.g., inverter housing assembly 120) is positioned in such a way that an outwardly facing surface of the top side wall 124a faces substantially upwards (e.g., as illustrated in at least FIGS. 3A-B), the inverter housing assembly (e.g., inverter housing assembly 120), including the structure (e.g., structure 127), may be operable to prevent a downfall of rain, snow, or other naturally falling liquids from entering into the inverter housing assembly (e.g., inverter housing assembly 120) and/or flowing onto the inverter subsystem (e.g., inverter subsystem 110) housed in the main cavity (e.g., main cavity 122) of the inverter housing assembly (e.g., inverter housing assembly 120). As used above and in the present disclosure, the inverter housing assembly (e.g., inverter housing assembly 120) may be considered as being "positioned in such a way that an outwardly facing surface of the top side wall 124a faces substantially upwards", or the like, when an axis formed by the inverter housing assembly (e.g., inverter housing assembly 120) (e.g., axis $y_1$, as illustrated in FIG. 1D) deviates from an axis directed upwards and/or opposite the direction of the downfall of rain, snow, or other naturally falling liquids (e.g., axis $y_2$, as illustrated in FIG. 3B) by not more than between about 0-45°, preferably between about 0-30°, and more preferably between about 0-20°.

Although not shown in the figures, the inverter housing assembly (e.g., inverter housing assembly 120) may also have one or more of the following configurations of air inflow sections (e.g., air inflow section 126), or combinations thereof: one or more air inflow sections (e.g., air inflow section 126) on the bottom side wall 124b and one or more air inflow sections (e.g., air inflow section 126) on one or both of the left side wall 124e and right side wall 124f; one or more air inflow sections (e.g., air inflow section 126) on the bottom side wall 124*b* and one or more air inflow sections (e.g., air inflow section 126) on one or both of the front side wall 124*c* and rear side wall 124*d*; one or more air inflow sections (e.g., air inflow section 126) on one or both of the left side wall 124*e* and right side wall 124*f* and one or more air inflow sections (e.g., air inflow section 126) on one or both of the front side wall 124*c* and rear side wall 124*d*; and one or more air inflow sections (e.g., air inflow section 126) on one or more of the bottom side wall 124*b*, the front side wall 124*c*, the rear side wall 124*d*, left side wall 124*e*, and/or right side wall 124*f*.

ii. Air Outflow Section (e.g., Air Outflow Section 128).

An example embodiment of the air outflow section (e.g., air outflow section 128) may be for use in allowing an outflow of air from the main cavity (e.g., main cavity 122). For example, the air outflow section (e.g., air outflow section 128) may be for use in allowing an outflow of air from at least the ventilation channel (e.g., ventilation channel 125).

The inverter housing assembly (e.g., inverter housing assembly 120) may include one or more air outflow sections (e.g., air outflow section 128), and such one or more air outflow sections (e.g., air outflow section 128) may be provided in one or more of a plurality of locations on the inverter housing assembly (e.g., inverter housing assembly 120). Furthermore, the one or more air outflow sections (e.g., air outflow section 128) may be formed in one or more of a plurality of configurations, shapes, and/or sizes. For example, the air outflow section (e.g., air outflow section 128) may be provided on an upper or top portion of the inverter housing assembly (e.g., inverter housing assembly 120). The upper portion of the inverter housing assembly (e.g., inverter housing assembly 120) may be a portion opposite to the bottom side wall 124*b*. As illustrated in FIG. 1A-E, the air outflow section (e.g., air outflow section 128) may be provided on the top side wall 124*a* in the form of one opening. The air outflow section (e.g., air outflow section 128) may also be provided on the top side wall 124*a* in the form of a plurality of openings.

In example embodiments, one or more of the air outflow sections (e.g., air outflow section 128), including those described above and in the present disclosure, may be formed next to, along with, integrated with, and/or by a top structure (e.g., top structure 129, as illustrated in FIGS. 1A-D). The top structure (e.g., top structure 129) may be a structure that protrudes outwardly from an outwardly facing surface of the top side wall 124*a*. In an example embodiment, the one or more top structures (e.g., top structure 129) may include or be formed as a handle (e.g., handle 129). The handle (e.g., handle 129) may be for use in portably transporting the portable power conversion system (e.g., power conversion system 100). It is recognized in the present disclosure that such one or more top structures (e.g., top structure 129) may be operable to prevent liquid, such as a downfall of rain, snow, or other naturally falling liquids, from entering into the inverter housing assembly (e.g., inverter housing assembly 120) and/or flowing onto the inverter subsystem (e.g., inverter subsystem 110). For example, when the inverter housing assembly (e.g., inverter housing assembly 120) is positioned in such a way that an outwardly facing surface of the top side wall 124*a* faces substantially upwards (e.g., as illustrated in at least FIGS. 3A-B), the inverter housing assembly (e.g., inverter housing assembly 120), including the top structure (e.g., top structure 129), may be operable to prevent a downfall of rain, snow, or other naturally falling liquids from entering into the inverter housing assembly (e.g., inverter housing assembly 120) and/or flowing onto the inverter subsystem (e.g., inverter subsystem 110) housed in the main cavity (e.g., main cavity 122) of the inverter housing assembly (e.g., inverter housing assembly 120).

The upper portion of the inverter housing assembly (e.g., inverter housing assembly 120) may also be a top or upper portion of another side wall (such as an upper portion of the left side wall 124*e*, right side wall 124*f*, front side wall 124*c*, and/or rear side wall 124*d*). For example, as illustrated in FIGS. 1B and 1E, one or more of the air outflow sections (e.g., air outflow section 128) may be provided on an upper portion of the left side wall 124*e* and/or right side wall 124*f*. Such one or more air outflow sections (e.g., air outflow section 128) may be formed next to, along with, integrated with, and/or by a structure (e.g., structure 129, as illustrated in FIGS. 1B and 1E). The structure (e.g., structure 129) may be a structure that protrudes outwardly from an upper portion of an outwardly facing surface of the left side wall 124*e* and/or right side wall 124*f*.

For illustration purposes, FIG. 1E (when used to illustrate an example embodiment of the air outflow section (e.g., air outflow section 128)), represents a cross-sectional view along a plane parallel to plane B (as indicated in FIG. 1B) of an example embodiment of the inverter housing subsystem (e.g., inverter housing subsystem 120) having an air outflow section (e.g., air outflow section 128) provided on an upper portion of the left side wall 124*e*, right side wall 124*f*.

In an example embodiment, the one or more structures (e.g., structure 129) may include or be formed as a handle (e.g., handle 129). The handle (e.g., handle 129) may be operable for use in portably transporting the portable power conversion system (e.g., power conversion system 100). It is recognized in the present disclosure that such one or more structures (e.g., structure 129) may be operable to prevent liquid, such as a downfall of rain, snow, or other naturally falling liquids, from entering into the inverter housing assembly (e.g., inverter housing assembly 120) and/or flowing onto the inverter subsystem (e.g., inverter subsystem 110). For example, when the inverter housing assembly (e.g., inverter housing assembly 120) is positioned in such a way that an outwardly facing surface of the top side wall 124*a* faces substantially upwards (e.g., as illustrated in at least FIGS. 3A-B), the inverter housing assembly (e.g., inverter housing assembly 120), including the top structure (e.g., top structure 129), may be operable to prevent a downfall of rain, snow, or other naturally falling liquids from entering into the inverter housing assembly (e.g., inverter housing assembly 120) and/or flowing onto the inverter subsystem (e.g., inverter subsystem 110) housed in the main cavity (e.g., main cavity 122) of the inverter housing assembly (e.g., inverter housing assembly 120).

Although not shown in the figures, the inverter housing assembly (e.g., inverter housing assembly 120) may also have one or more of the following configurations of air outflow sections (e.g., air outflow section 128), or combinations thereof: one or more air outflow sections (e.g., air outflow section 128) on the top side wall 124*a* and one or more air outflow sections (e.g., air outflow section 128) on one or both of the left side wall 124*e* and right side wall 124*f*; one or more air outflow sections (e.g., air outflow section 128) on the top side wall 124*a* and one or more air outflow sections (e.g., air outflow section 128) On one or both of the front side wall 124*c* and rear side wall 124*d*; one or more air outflow sections (e.g., air outflow section 128) on one or both of the left side wall 124*e* and right side wall 124*f* and one or more air outflow sections (e.g., air outflow section 128) on one or both of the front side wall 124*c* and rear side wall 124*d*; and one or more air outflow sections (e.g., air outflow section 128) on one or more of the top side wall 124*a*, the front side wall 124*c*, the rear side wall 124*d*, left side wall 124*e*, and/or right side wall 124*f*.

The possible combinations of air outflow sections (e.g., air outflow section 128), including those described above and in the present disclosure, may also be combined with the possible combinations of air inflow sections (e.g., air inflow section 126), including those described above and in the present disclosure, without departing from the teachings of the present disclosure.

Example embodiments of the power conversion system (e.g., power conversion system 100), as described above and in the present disclosure, may be operable for use to provide AC power to electrical devices. For example, the power conversion system (e.g., power conversion system 100) may be placed on and/or attached to a stationary object, platform/floor, or the like (e.g., as illustrated in FIGS. 3A-B). A power cable (e.g., cable 113) attached or attachable to the input section (e.g., input section 112) of the inverter subsystem (e.g., inverter subsystem 110) may be extended to a power source (e.g., battery 102) and attached to the respective terminals (e.g., positive, negative, and/or ground terminals) of the power source (e.g., battery 102). In certain situations, such as situations where the power source is a DC battery installed and/or operating in a vehicle (e.g., 12 volt DC (VDC) car battery 102 and the vehicle (e.g., vehicle's engine/alternator) is running operating to power the battery), in order to avoid, prevent, stop, and/or reduce a "spark" or surge or leakage of electricity from occurring at the power source (e.g., car battery 102) upon connecting the power cable (e.g., cable 102, which may be a booster cable with alligator clips or other forms of connectors normally used to connect to car batteries), the inverter subsystem (e.g., inverter subsystem 110) may be further provided with an activation switch, controller, button, or the like (hereinafter "activation controller", not shown in the figures). The activation controller may be any switch, actuator, controller, or the like, or any element, component, device, software-implemented or controlled function, or the like, operable to act as a switch, actuator, controller, or the like, for, among other things, allowing and/or not allowing (or enabling and/or not enabling, or turning on and/or turning off) the inverter subsystem (e.g., inverter subsystem 110) to perform a conversion of input DC voltage to output AC voltage (or vice versa). For example, when the activation controller is actuated to an OFF position, the inverter subsystem (e.g., inverter subsystem 110) may be configurable to not perform (or prevent from performing) any conversion of input DC voltage into output AC voltage (or vice versa), and/or may serve as an open circuit, or the like, so as to not allow current to pass through. When the activation controller is actuated to an ON position, the inverter subsystem (e.g., inverter subsystem 110) may be configurable to perform (or enable the performing of) conversion of input DC voltage (e.g., from battery of a running vehicle) into output AC voltage (and/or vice versa), and/or may serve as a closed circuit, or the like, so as to allow current to pass through. It is recognized in the present disclosure that such example embodiments of the activation controller may enable, among other things, avoiding, preventing, stopping, and/or reducing the "spark" or surge leakage of electricity mentioned above and in the present disclosure. In operation, when attaching the power cables (e.g., cable 113) to the respective terminals (e.g., positive, negative, and/or ground terminals) of the power source (e.g., car battery 102), the activation controller may be actuated to be in the OFF position. Once the power cables (e.g., cable 113) are attached to the power source (e.g., car battery 102 of a running vehicle), the activation controller may then be actuated to be in the ON position, thereby allowing the inverter subsystem (e.g., inverter subsystem 110) to perform, among other things, the conversion of input DC voltage from the power source (e.g., car battery 102) to output AC voltage to electrical devices (e.g., electrical device 104). Other example embodiments of the activation controller are also contemplated without departing from the teachings of the present disclosure.

Processing Subsystem (e.g., Processing Subsystem 130).

In an example embodiment, the power conversion system (e.g., power conversion system 100) may include a processing subsystem (e.g., processing subsystem 130). The processing subsystem (e.g., processing subsystem 130) may be provided and secured to one or more portions of the power conversion system (e.g., power conversion system 100). For example, the processing subsystem (e.g., processing subsystem 130) may be secured to the inverter subsystem (e.g., inverter subsystem 110), as illustrated in FIGS. 1C-D. Although not shown in the figures, the processing subsystem (e.g., processing subsystem 130) may also be secured to an inwardly facing surface (or outwardly facing surface) of one or more of the side walls. For example, the processing subsystem (e.g., processing subsystem 130) may be secured to an inwardly facing surface of the rear side wall 124*d* or the front side wall 124*c*. As another example, the processing subsystem (e.g., processing subsystem 130) may be secured to an inwardly facing surface of the left side wall 124*e* or the right side wall 124*f*. In yet another example, the processing subsystem (e.g., processing subsystem 130) may be secured to an inwardly facing surface of the top side wall 124*a* or bottom side wall 124*b*.

Figure 1H:
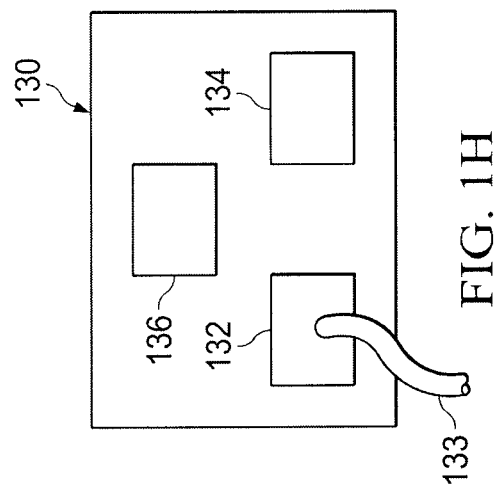
FIG. 1H is a functional view of an example embodiment of a processing subsystem.
Figure 1G:
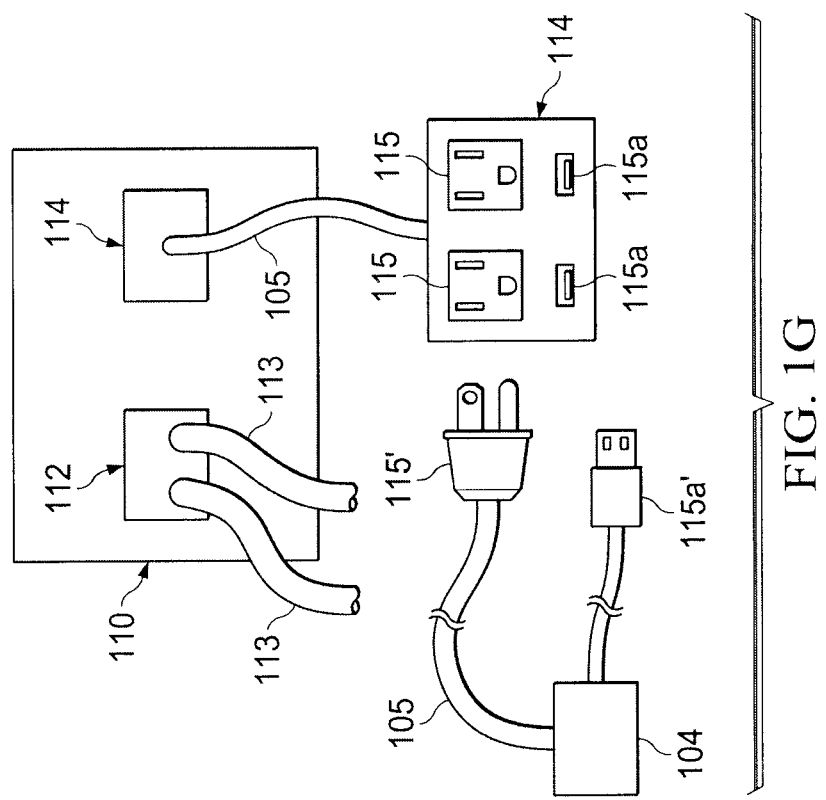
FIG. 1G is a side view of another example embodiment of an inverter subsystem having an input section and an output section, along with an electrical device.

As illustrated in FIG. 1H, the processing subsystem (e.g., processing subsystem 130) may include a monitoring assembly (e.g., monitoring assembly 132). The processing subsystem (e.g., processing subsystem 130) may include a communication assembly (e.g., communication assembly 134). The processing subsystem (e.g., processing subsystem 130) may include a processor (e.g., processor 136). These elements of the processing subsystem (e.g., processing subsystem 130) are further explained below with reference to the accompanying figures.

i. Monitoring Assembly (e.g., Monitoring Assembly 132)

An example embodiment of the monitoring assembly (e.g., monitoring assembly 132) may be electrically connected to the inverter subsystem (e.g., inverter subsystem 110). For example, the monitoring assembly (e.g., monitoring assembly 132) may be connected to the output section (e.g., output section 114) via a cable or wire (e.g., cable 133), as illustrated in FIGS. 1F and 1H. As another example, the monitoring assembly (e.g., monitoring assembly 132) may also be connected to the input section (e.g., input section 112) via a cable or wire (e.g., cable 133), as illustrated in FIGS. 1F and 1H.

Although the figures illustrate one monitoring assembly (e.g., monitoring assembly 132), it is to be understood that example embodiments of the power conversion system (e.g., power conversion system 100) may include more than one monitoring assembly without departing from the teachings of the present disclosure. Furthermore, although the figures may illustrate the monitoring assembly (e.g., monitoring assembly 132) to be a single or unitary element, it is to be understood that example embodiments may provide for the monitoring assembly (e.g., monitoring assembly 132) to be physically separate elements.

The monitoring assembly (e.g., monitoring assembly 132) may be configurable to measure, obtain, and/or calculate information, such as information pertaining to use, usage, available or remaining use, and/or operation of the overall power conversion system (e.g., power conversion system 100). For example, the monitoring assembly (e.g., monitoring assembly 132) may be configurable to measure, obtain, and/or calculate one or more measurements. An example measurement measured, obtained, and/or calculated by the monitoring assembly (e.g., monitoring assembly 132) may include a measurement of the input DC voltage at the input section (e.g., input section 112) of the inverter subsystem (e.g., inverter subsystem 110). Another example measurement measured, obtained, and/or calculated by the monitoring assembly (e.g., monitoring assembly 132) may include a measurement of the output AC voltage at the output section (e.g., output section 114) of the inverter subsystem (e.g., inverter subsystem 110). Another example measurement measured, obtained, and/or calculated by the monitoring assembly (e.g., monitoring assembly 132) may include a measurement of the ambient temperature (e.g., temperature surrounding the power conversion system (e.g., power conversion system 100) or inside the main cavity (e.g., main cavity 122)). Another example measurement measured, obtained, and/or calculated by the monitoring assembly (e.g., monitoring assembly 132) may include a measurement (which may also be performed, in part or in whole, by the processor (e.g., processor 136) and/or computing device (e.g., computing device 150)) of the available capacity (e.g., voltage) of the DC power source (e.g., battery 102) before reaching a threshold value. As used in the present disclosure, a threshold value may be any predetermined value, including a value before or at which the DC power source (e.g., battery 102) reaches a predetermined capacity percentage and/or becomes depleted or near depleted. Another example measurement measured, obtained, and/or calculated by the monitoring assembly (e.g., monitoring assembly 132) may include a measurement (which may also be performed by the processor (e.g., processor 136) and/or computing device (e.g., computing device 150)) of the available time remaining before the DC power source (e.g., battery 102) reaches a threshold value. Another example measurement measured, obtained, and/or calculated by the monitoring assembly (e.g., monitoring assembly 132) may include a measurement (which may also be performed by the processor (e.g., processor 136) and/or computing device (e.g., computing device 150)) of the amount of time the power conversion system (e.g., power conversion system 100) has been in operation. The monitoring assembly (e.g., monitoring assembly 132) may also be configurable to determine whether the activation controller is in an ON or OFF position (or any other available positions, such as STANDBY, etc.).

It is to be understood that other measurements measured, obtained, and/or calculated by the monitoring assembly (e.g., monitoring assembly 132) pertaining to the use, usage, available or remaining use, and/or operation of the power conversion system (e.g., power conversion system 100) are contemplated without departing from the teachings of the present disclosure. It is also to be understood in the present disclosure that measurements performed by the monitoring assembly (e.g., monitoring assembly 132), including those described above and in the present disclosure, each as applicable, may be performed based on, among other things, a current draw/load, average draw/load, maximum draw/load, minimum draw/load, mean draw/load, and/or other magnitude and/or duration of draw/load by or of the output section (e.g., output section 114), without departing from the teachings of the present disclosure.

ii. Communication Assembly (e.g., Communication Assembly 134)

An example embodiment of the communication assembly (e.g., communication assembly 134) may be in communication with one or more elements of the power conversion system (e.g., power conversion system 100). For example, the communication assembly (e.g., communication assembly 134) may be in communication with the monitoring assembly (e.g., monitoring assembly 132). The communication assembly (e.g., communication assembly 134) may be in communication with the processor (e.g., processor 136). In example embodiments, the communication assembly (e.g., communication assembly 134), the monitoring assembly (e.g., monitoring assembly 132), and/or the processor (e.g., processor 136) may be considered and/or formed as one integrated element or separated as separate elements.

Although the figures illustrate one communication assembly (e.g., communication assembly 134), it is to be understood that example embodiments of the power conversion system (e.g., power conversion system 100) may include more than one communication assembly without departing from the teachings of the present disclosure. Furthermore, although the figures may illustrate the communication assembly (e.g., communication assembly 134) to be a single or unitary element, it is to be understood that example embodiments may provide for the communication assembly (e.g., communication assembly 134) to be physically separate elements.

Figure 2:
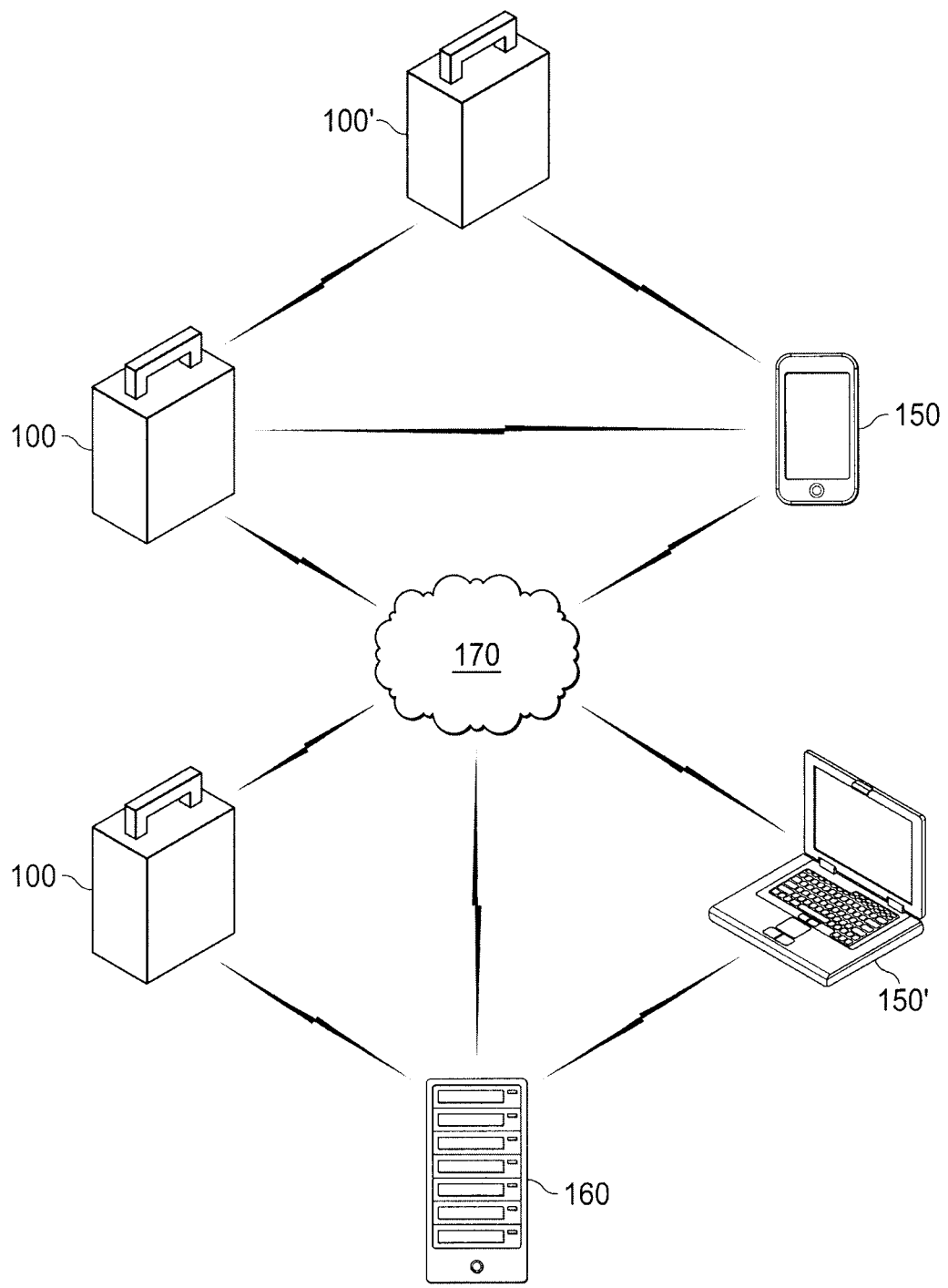
FIG. 2 is a functional view of a power conversion system network.

As illustrated in FIG. 2, the communication assembly (e.g., communication assembly 134) may be in communication with a computing device (e.g., computing device 150), either directly or indirectly. For example, the communication assembly (e.g., communication assembly 134) may be configurable to communicate information (such as one or more measurements measured, obtained, and/or calculated by the monitoring assembly (e.g., monitoring assembly 132)) to the computing device (e.g., computing device 150). The communication assembly (e.g., communication assembly 134) may also be configurable to communicate a status of the activation controller, such as whether the activation controller is in an ON or OFF position (or any other available positions, such as STANDBY, etc.).

As used above and in the present disclosure, communications may be in one or more of a plurality of forms and ways, including directly via Bluetooth, Wi-Fi, NFC, RF, and/or other wireless or wired forms of communication, or the like, and/or indirectly, such as via one or more network elements, another computing device, or even another power conversion system (e.g., power conversion system 100', as illustrated in FIG. 2). In regards to the latter, in situations wherein a user deploys more than one power conversion system (e.g., power conversion system 100 and power conversion system 100'), a distal power conversion system (e.g., power conversion system 100) may communicate information to the computing device (e.g., computing device 150) via another power conversion system (e.g., power conversion system 100') (e.g., relaying, rebroadcasting, and/or retransmitting information), which may be particularly useful in situations where the distal power conversion system (e.g., power conversion system 100) is located at a significant distance from (i.e., beyond range) the computing device (e.g., computing device 150) and/or there is a blockage of signal transmissions between the distal power conversion system (power conversion system 100) and the computing device (e.g., computing device 150).

The communication assembly (e.g., communication assembly 134) may also be in communication with a network (e.g., network 170), such as for communications to a computing device (e.g., computing device 150 and/or 150'), an electrical device (e.g., electrical device 104), a communication assembly (e.g., communication assembly 134) of another power conversion system (e.g., power conversion system 100 or 100'), another network (e.g., network 170), database (e.g., database 160), cloud-based computing, etc., either directly or indirectly. The communication assembly (e.g., communication assembly 134) may also be in communication with a database (e.g., database 160), either directly or indirectly. For example, such communication with network (e.g., network 170), cloud-based computing, and/or database (e.g., database 160) may be useful and/or applicable for allowing remotely located computing devices (e.g., computing device 150'), smart appliances (e.g., electrical device 104), communication assembly (e.g., communication assembly 134) of another power conversion system (e.g., power conversion system 100 or 100'), another network (e.g., network 170), another database (e.g., database 160), etc. to receive and/or access information, for purposes of storing/retrieving information, and/or to perform one or more actions. As an example, the communication assembly (e.g., communication assembly 134) may be configurable to communicate, either directly or via network (e.g., network 170), with a smart appliance (e.g., electrical device 104) connected to and receiving output AC power from the power conversion system (e.g., power conversion system 100) so as to notify or alert the smart appliance (e.g., electrical device 104) that the power source will soon be depleted. In such an example, the smart appliance (e.g., electrical device 104) may then be able to take action, such as perform a proper shutdown or power down and/or notify the user (e.g., email, SMS, via a push notification to a mobile application, etc.).

The communication assembly (e.g., communication assembly 134) may also be in communication with one or more elements of another power conversion system (e.g., power conversion system 100', as illustrated in FIG. 2), as described above and in the present disclosure. For example, the communication assembly (e.g., communication assembly 134) of a distal power conversion system (e.g., power conversion system 100) may communicate measurements (e.g., input DC power at an input section (e.g., input section 112)) to another power conversion system (e.g., power conversion system 100') so that such power conversion system (e.g., power conversion system 100') can communicate such measurements to the computing device (e.g., computing device 150). As another example, the communication assembly (e.g., communication assembly 134) of a power conversion system (e.g., power conversion system 100) may send a request (e.g., via a request from computing device (e.g., computing device 150 and/or 150'), network (e.g., network 170), and/or the cloud) to another communication assembly (e.g., communication assembly 134) of a distal power conversion system (e.g., power conversion system 100') to send over one or more measurements. Such request may be performed for one or more of a plurality of reasons, such as to enable a consolidated reporting to the computing device (e.g., computing device 150), because the computing device (e.g., computing device 150) cannot communicate with the distal power conversion system (e.g., power conversion system 100'), etc.

Another example application of such communication between two or more power conversion systems may be in example configurations pertaining to more sophisticated configurations—such as in example embodiments where two or more power conversion system (e.g., power conversion system 100 and power conversion system 100') are connected to two or more separate batteries and cooperate to receive DC power from the two or more batteries and/or supply AC power to a plurality of electrical devices.

It is to be understood in the present disclosure that the communication assembly (e.g., communication assembly 134) may communicate information, either wirelessly or via wires, including one or more measurements performed by the monitoring assembly (e.g., monitoring assembly 132), to one or more computing devices (e.g., computing device 150 and/or 150'), one or more electronic devices (e.g., electronic devices 104), one or more other power conversion systems (e.g., power conversion system 100'), one or more networks (e.g., network 170), and/or one or more databases (e.g., database 160). It is also to be understood in the present disclosure that communications between the communication assembly (e.g., communication assembly 134) may be secure and/or encrypted communications. It is also to be understood in the present disclosure that the communication assembly (e.g., communication assembly 134) may be configurable to establish a wireless (or wired) connection with one or more computing devices (e.g., computing device 150 and/or 150'), one or more electrical devices (e.g., electrical device 104), one or more other power conversion systems (e.g., power conversion system 100'), one or more networks (e.g., network 170), and/or one or more databases (e.g., database 160). It is also to be understood in the present disclosure that a connection between the communication assembly (e.g., communication assembly 134) and one or more devices (as described above and in the present disclosure) may be a secure and/or encrypted connection.

iii. Processor (e.g., Processor 136).

An example embodiment of the processor (e.g., processor 136) may be in communication with and/or control an operation of one or more elements of the power conversion system (e.g., power conversion system 100). For example, the processor (e.g., processor 136) may be in communication with and/or control an operation of the monitoring assembly (e.g., monitoring assembly 132). The processor (e.g., processor 136) may be in communication with and/or control an operation of the communication assembly (e.g., communication assembly 134). In example embodiments, the communication assembly (e.g., communication assembly 134), the monitoring assembly (e.g., monitoring assembly 132), and/or the processor (e.g., processor 136) may be considered and/or formed as one integrated element or separated as separate elements. The processor (e.g., processor 136) may also be configurable to control an operation of the activation controller, such as actuate the activation controller to be in an ON or OFF position (or any other available positions, such as STANDBY, etc.) and/or change from one position to another position.

Although the figures illustrate one processor (e.g., processor 136), it is to be understood that example embodiments of the power conversion system (e.g., power conversion system 100) may include more than one processor without departing from the teachings of the present disclosure. Furthermore, although the figures may illustrate the processor (e.g., processor 136) to be a single or unitary element, it is to be understood that example embodiments may provide for the processor (e.g., processor 136) to be physically separate elements.

The processor (e.g., processor 136) may be any processor, microprocessor, controller, microcontroller, microchip, mobile device, semiconductor device, or the like, configurable to perform a processing of information and/or other predetermined actions. The processor (e.g., processor 136) described herein may also include and/or be a part of a computing device. The processor (e.g., processor 136) may also include or be a part of a virtual machine, computer, node, instance, host, or machine in a networked computing environment. As used in the present disclosure, such a network and/or cloud (e.g., network 170), may be a collection of devices connected by communication channels that facilitate communications between devices and allow for devices to share resources. Such resources may encompass any types of resources for running instances including hardware (such as servers, clients, mainframe computers, networks, network storage, data sources, memory, central processing unit time, scientific instruments, and other computing devices), as well as software, software licenses, available network services, and other non-hardware resources, or a combination thereof. A network or cloud may include, but is not limited to, computing grid systems, peer to peer systems, mesh-type systems, distributed computing environments, cloud computing environment, etc. Such network or cloud may include hardware and software infrastructures configured to form a virtual organization comprised of multiple resources which may be in geographically disperse locations. Network may also refer to a communication medium between processes on the same device. Also as referred to herein, a network element, node, or server may be a device deployed to execute a program operating as a socket listener and may include software instances.

In an example embodiment, the processor (e.g., processor 136) may be configurable to determine, based on one or more measurements measured, obtained, and/or calculated by the monitoring assembly (e.g., monitoring assembly 132), an estimated amount of time (or voltage or power) remaining before a DC power source (e.g., battery 102) providing the input DC voltage to the input section (e.g., input section 112) reaches a threshold value and/or becomes depleted. For example, the one or more measurements used as a basis for the determining of the amount of time (or voltage or power) remaining includes a measurement of the input DC voltage at the input section (e.g., input section 112) and/or a measurement of the output AC voltage at the output section (e.g., output section 114).

Indicator Subsystem (e.g., Indicator Subsystem 140).

In an example embodiment, the power conversion system (e.g., power conversion system 100) may include an indicator subsystem (e.g., indicator subsystem 140). The indicator subsystem (e.g., indicator subsystem 140) may be provided and secured to one or more portions of the power conversion system (e.g., power conversion system 100). For example, the indicator subsystem (e.g., indicator subsystem 140) may be secured to an outwardly facing surface (or inwardly facing surface) of one or more of the side walls. Figure IA illustrates an example of the indicator subsystem (e.g., indicator subsystem 140) being provided on an outwardly facing surface of the front side wall 124c. Although not shown in the figures, the indicator subsystem (e.g., indicator subsystem 140) may also be secured to an outwardly facing surface of one or more other side walls. For example, the indicator subsystem (e.g., indicator subsystem 140) may be secured to an outwardly facing surface of the top side wall 124a, left side wall 124e, right side wall 124f, rear side wall 124d, and/or bottom side wall 124b.

In an example embodiment, the indicator subsystem (e.g., indicator subsystem 140) may include a measurement portion and a display portion.

The measurement portion of the indicator subsystem (e.g., indicator subsystem 140) may be configurable to measure, obtain, and/or calculate one or more measurements. For example, the measurement portion may be configurable to measure, obtain, and/or calculate a measurement of the input DC voltage at the input section (e.g., input section 112). It is to be understood in the present disclosure that the measurement portion of the indicator subsystem (e.g., indicator subsystem 140) may be able to measure, obtain, and/or calculate one, some, or all of the measurements in respect of which the monitoring assembly (e.g., monitoring assembly 132) can measure, obtain, and/or calculate. The measurement portion may also be configurable to determine the current position or status of the activation controller.

The display portion of the indicator subsystem (e.g., indicator subsystem 140) may be configurable to display, either through a graphical display or any other form of digital or mechanical display, information pertaining to measurements measured, obtained, and/or calculated by the measurement portion of the indicator subsystem (e.g., indicator subsystem 140). The display portion of the indicator subsystem (e.g., indicator subsystem 140) may be configurable to display information pertaining to measurements measured, obtained, and/or calculated by the processing subsystem (e.g., processing subsystem 130). For example, the measurements may be provided by the monitoring assembly (e.g., monitoring assembly 132). The display portion may also be configurable to display information provided by one or more other elements of the power conversion system (e.g., power conversion system 100), one or more computing devices (e.g., computing device 150), one or more electrical devices (e.g., electrical device 104), one or more other power conversion systems (e.g., power conversion system 100'), one or more networks (e.g., network 170), one or more databases (e.g., database 160), etc. The display portion may also be configurable to display a status of the activation controller, such as whether the activation controller is in the ON position or OFF position (or any other positions, such as a STANDBY position).

Computing Device (e.g., Computing Device 150).

In an example embodiment, the power conversion system (e.g., power conversion system 100) may include and/or be in communication with one or more computing devices (e.g., computing device 150). The computing device (e.g., computing device 150) may be any processor, microprocessor, controller, microcontroller, microchip, mobile device, semiconductor device, computing device, or the like, configurable to perform a processing of information and/or other predetermined actions.

The computing device (e.g., computing device 150) described herein may be directed to and/or include desktop computers, all-in-one computers, laptops, notebooks, ultrabooks, readers, electrical devices, tablets, phablets, mobile phones, PDAs, media players, remote controllers (e.g., a dedicated device to communicate with and/or operate the power conversion system (e.g., power conversion system 100), or parts thereof), a plurality of computing devices interacting together in part or in whole, and other specialized computing devices and industry-specific computing devices. The computing device (e.g., computing device 150) described herein may also be directed to wearable computing devices, including watches (such as the Apple Watch), etc. The computing device (e.g., computing device 150) may also may be a virtual machine, computer, node, instance, host, or machine in a networked computing environment. Such networked environment, and/or cloud, may be a collection of machines connected by communication channels that facilitate communications between machines and allow for machines to share resources. Such resources may encompass any types of resources for running instances including hardware (such as servers, clients, mainframe computers, networks, network storage, data sources, memory, central processing unit time, scientific instruments, and other computing devices), as well as software, software licenses, available network services, and other non-hardware resources, or a combination thereof.

In an example embodiment, the computing device (e.g., computing device 150) may be in communication with and/or control an operation of one or more elements of one or more power conversion systems (e.g., power conversion system 100 and 100'). For example, the computing device (e.g., computing device 150) may be in communication with and/or control an operation of one or more processors (e.g., processor 136). The computing device (e.g., computing device 150) may be in communication with and/or control an operation of one or more monitoring assemblies (e.g., monitoring assembly 132). The computing device (e.g., computing device 150) may be in communication with and/or control an operation of one or more communication assemblies (e.g., communication assembly 134). The computing device (e.g., computing device 150) may be in communication with and/or control an operation of one or more electrical devices (e.g., electrical device 104). The computing device (e.g., computing device 150) may also be in communication with and/or control an operation of the activation controller. For example, the computing device (e.g., computing device 150) may be configurable to actuate the activation controller to be in the ON position or OFF position, or change from one position to another position. The computing device (e.g., computing device 150) may also be configurable to control other features of the activation controller, such as disabling actuation of the activation controller at the power conversion system (e.g., power conversion system 100) and/or inverter subsystem (e.g., inverter subsystem 110). An example use for such a feature may be to prevent (or not enable) an authorized person present at the power conversion system (e.g., power conversion system 100) and/or inverter subsystem (e.g., inverter subsystem 110) from turning on or off the power conversion system (e.g., power conversion system 100) and/or inverter subsystem (e.g., inverter subsystem 110) via actuating of the activation controller.

Example Embodiments of a Method of Forming a Portable Power conversion System (e.g., Method 200)

Figure 4:
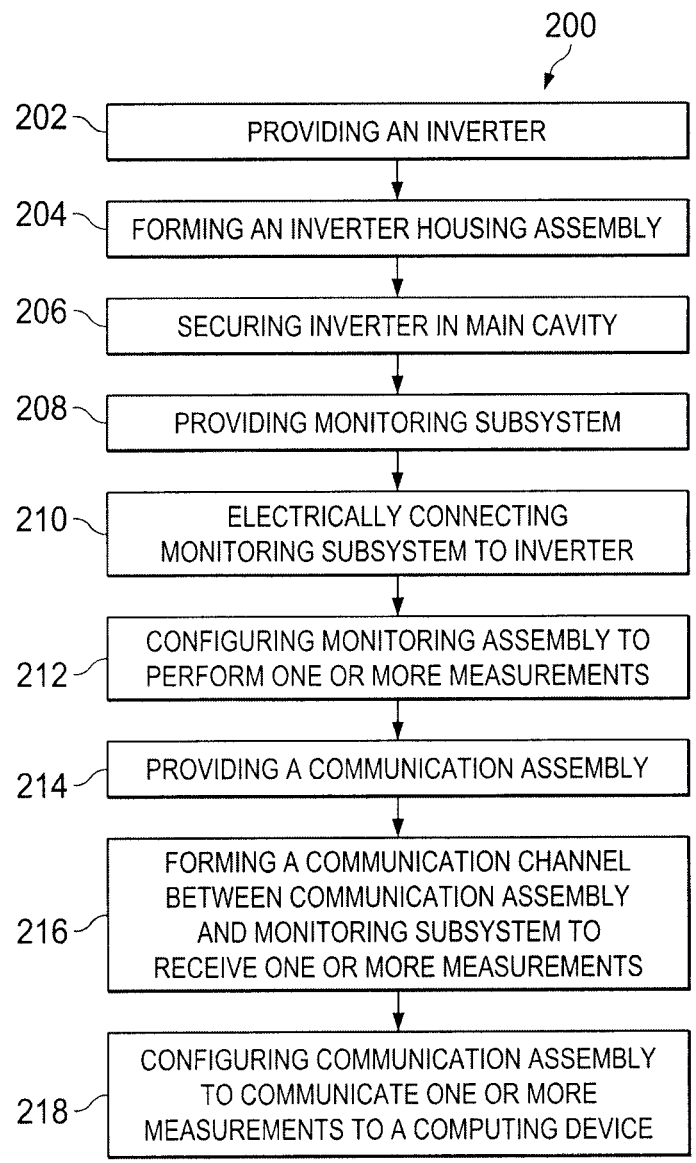
FIG. 4 is an illustration of an example embodiment of a method of forming a power conversion system.

FIG. 4 illustrates an example embodiment of a method of forming a portable power conversion system. In example embodiments, the portable power conversion system (e.g., power conversion system 100) may be operable to provide and/or remotely monitor the providing of AC power to one or more electrical devices (e.g., electrical device 104) via a power source (e.g., battery 102). The power source (e.g., battery 102) may be a battery installed and operating in a vehicle, as illustrated in FIGS. 3A-B. Situations of use may include emergency and non-emergency situations.

Example embodiments of the method (e.g., method 200) may include, but are not limited to, one or more of the following actions: (1) providing an inverter (e.g., action 202); (2) forming an inverter housing assembly (e.g., action 204); (3) securing an inverter in a main cavity of the inverter housing assembly (e.g., action 206); (4) providing a monitoring assembly (e.g., action 208); (5) electrically connecting the monitoring assembly to the inverter (e.g., action 210); (6) configuring the monitoring assembly to perform one or more measurements (e.g., action 212); (7) providing a communication assembly (e.g., action 214); (8) forming a communication channel between the communication assembly and the monitoring assembly to receive one or more measurements (e.g., action 216); and (9) configuring the communication assembly to communicate one or more measurements to a device (e.g., action 218).

Example embodiments of the power conversion system (e.g., power conversion system 100) may be used according to one or more of the above and below actions, may include additional actions, may be performable in different sequences, and/or one or more of the actions may be combinable into a single action or divided into two or more actions. Inverters other than pure sine wave inverters are also contemplated in example embodiments without departing from the teachings of the present disclosure. These actions and inverter systems will now be explained with references to the figures.

(1) Providing an Inverter (e.g., Action 202).

The method (e.g., method 200) may include providing an inverter (e.g., action 202). The inverter may be any inverter, including example embodiments of the inverter subsystem (e.g., inverter subsystem 110) described above and in the present disclosure. The inverter (e.g., inverter subsystem 110) may include an input section (e.g., input section 112) for receiving an input DC voltage. The inverter (e.g., inverter subsystem 110) may include an output section (e.g., output section 114) for providing an output AC voltage based on the input DC voltage received by the input section (e.g., input section 112).

(2) Forming an Inverter Housing Assembly (e.g., Action 204).

The method (e.g., method 200) may include forming an inverter housing assembly (e.g., action 204). The inverter housing assembly may include example embodiments of the inverter housing assembly (e.g., inverter housing assembly 120) described above and in the present disclosure. For example, the inverter housing assembly may be formed in such a way as to include a plurality of side walls (e.g., top side wall 124a, bottom side wall 124b, front side wall 124c, rear side wall 124d, left side wall 124e, and/or right side wall 124θ and a main cavity (e.g., main cavity 122) formed by at least some of the plurality of side walls. The main cavity (e.g., main cavity 122) may be formed in such a way as to enable the main cavity (e.g., main cavity 122) to house the inverter (e.g., inverter subsystem 110) and form a ventilation channel (e.g., ventilation channel 125). The inverter housing assembly may further be formed in such a way as to include an air inflow section (e.g., air inflow section 126). The air inflow section (e.g., air inflow section) may be for use in allowing an inflow of air into at least the ventilation channel (e.g., ventilation channel 125). The inverter housing assembly may further be formed in such a way as to include an air outflow section (e.g., air outflow section 128). The air outflow section (e.g., air outflow section 128) may be for use in allowing an outflow of air from at least the ventilation channel (e.g., ventilation channel 125).

(3) Securing an Inverter in a Main Cavity of the Inverter Housing Assembly (e.g., Action 206).

The method (e.g., method 200) may include securing the inverter (e.g., inverter subsystem 110) in the main cavity (e.g., main cavity 122) of the inverter housing assembly (e.g., inverter housing assembly 120) (e.g., action 206). The inverter (e.g., inverter subsystem 110) may be secured to the inwardly facing surface of one or more of the side walls, such as the inwardly facing surface of the rear side wall 124*d*, front side wall 124*c*, left side wall 124*e*, right side wall 124*f*, top side wall 124*a*, and/or bottom side wall 124*b*.

(4) Providing a Monitoring Assembly (e.g., Action 208).

The method (e.g., method 200) may include providing a processing subsystem and/or monitoring assembly (e.g., action 208). The monitoring assembly may include one or more example embodiments of the monitoring assembly (e.g., monitoring assembly 132) described above and in the present disclosure. The monitoring assembly (e.g., monitoring assembly 132) may be secured as described above and in the present disclosure. The processing subsystem may include one or more example embodiments of the processing subsystem (e.g., processing subsystem 130), which may also include the monitoring assembly (e.g., monitoring assembly 132), as well as a processor (e.g., processor 136) and communication assembly (e.g., communication assembly 134). It is to be understood in the present disclosure that if the processing subsystem is provided in action 208, then certain other actions, such as action 214, may not be required.

(5) Electrically Connecting the Monitoring Assembly to the Inverter (e.g., Action 210).

The method (e.g., method 200) may include connecting the monitoring assembly (e.g., monitoring assembly 132) to the inverter subsystem (e.g., inverter subsystem 110) (e.g., action 210). For example, such connection may be an electrical connection so as to allow the monitoring assembly (e.g., monitoring assembly 132) to measure, obtain, and/or calculate measurements, as described above and in the present disclosure.

(6) Configuring the Monitoring Assembly to Perform One or More Measurements (e.g., Action 212).

The method (e.g., method 200) may include configuring the monitoring assembly (e.g., monitoring assembly 132) to measure, obtain, and/or calculate one or more measurements (e.g., action 212), as described above and in the present disclosure. For example, the monitoring assembly (e.g., monitoring assembly 132) may be configured to at least measure, obtain, and/or calculate a measurement of the input DC voltage at the input section (e.g., input section 112).

(7) Providing a Communication Assembly (e.g., Action 214).

The method (e.g., method 200) may include providing a processing subsystem and/or communication assembly (e.g., action 214). The communication assembly may include one or more example embodiments of the communication assembly (e.g., communication assembly 134) described above and in the present disclosure. The communication assembly (e.g., communication assembly 134) may be secured as described above and in the present disclosure. The processing subsystem may include one or more example embodiments of the processing subsystem (e.g., processing subsystem 130), which may also include the communication assembly (e.g., communication assembly 134), as well as a processor (e.g., processor 136) and monitoring assembly (e.g., monitoring assembly 132). It is to be understood in the present disclosure that if the processing subsystem is provided in action 214, then certain other actions, such as action 208 may not be required.

(8) Forming a Communication Channel Between the Communication Assembly and the Monitoring Assembly to Receive One or More Measurements (e.g., Action 216).

The method (e.g., method 200) may include forming a communication channel between the communication assembly (e.g., communication assembly 134) and the monitoring subsystem (e.g., monitoring subsystem 132) so as to receive, at the communication assembly (e.g., communication assembly 134) from the monitoring subsystem (e.g., monitoring assembly 132), one or more measurements measured, obtained, and/or calculated by the monitoring assembly (e.g., monitoring assembly 132) (e.g., action 216).

(9) Configuring the Communication Assembly to Communicate One or More Measurements to a Device (e.g., Action 218).

The method (e.g., method 200) may include configuring the communication assembly (e.g., communication assembly 134) to communicate, to a device having and/or capable of having an established communication channel with the communication assembly (e.g., communication assembly 134) (e.g., action 218). Such communication may include communicating one or more measurements measured, obtained, and/or calculated by the monitoring assembly (e.g., monitoring assembly 132). Such device may include, but is not limited to, one or more example embodiments of the computing device (e.g., computing device 150), electrical device (e.g., electrical device 104), another power conversion system (e.g., power conversion system 100 and/or 100'), network (e.g., network 170), and/or database (e.g., database 160) described above and in the present disclosure.

Example Embodiments of a Method of Providing and/or Remotely Monitoring the Providing of AC Power to One or More Electrical Devices (e.g., Method 300).

Figure 5:
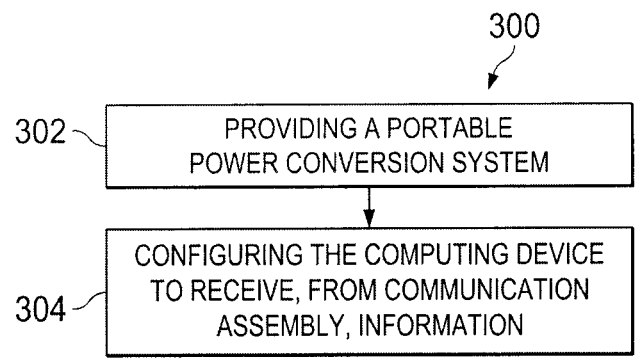
FIG. 5 is an illustration of an example embodiment of a method of providing and remotely monitoring the providing of AC power via a power source.

FIG. 5 illustrates an example embodiment of a method of providing and/or remotely monitoring the providing of AC power to one or more electrical devices via power source (e.g., method 300). The power source (e.g., battery 102) may be a battery installed and operating in a vehicle, as illustrated in FIGS. 3A-B. Situations of use may include emergency and non-emergency situations.

Example embodiments of the method (e.g., method 300) may include, but are not limited to, one or more of the following actions: (1) providing a portable power conversion system (e.g., action 302); and (2) configuring a computing device to receive information from a power conversion system (e.g., action 304).

Example embodiments of the power conversion system (e.g., power conversion system 100) may be used according to one or more of the above and below actions, may include additional actions, may be performable in different sequences, and/or one or more of the actions may be combinable into a single action or divided into two or more actions. Inverters other than pure sine wave inverters are also contemplated in example embodiments without departing from the teachings of the present disclosure. These actions and inverter systems will now be explained with references to the figures.

(1) Providing a Portable Power Conversion System (e.g., Action 302).

The method (e.g., method 300) may include providing a power conversion system (e.g., action 302). The power conversion system may include one or more example embodiments of the power conversion system (e.g., power conversion system 100) described above and in the present disclosure.

In an example embodiment, the provided power conversion system (e.g., power conversion system 100) may include an inverter subsystem (e.g., inverter subsystem 110). The inverter subsystem (e.g., inverter subsystem 110) may include one or more example embodiments described above and in the present disclosure. For example, the inverter subsystem (e.g., inverter subsystem 110) may include an input section (e.g., input section 112) for receiving an input DC voltage from a power source (e.g., battery 102) and an output section (e.g., output section 114) for providing an output AC voltage to the one or more electrical devices (e.g., electrical device 104) based on the input DC voltage received by the input section (e.g., input section 112).

The provided power conversion system (e.g., power conversion system 100) may further include an inverter housing assembly (e.g., inverter housing assembly 120) for housing the inverter subsystem (e.g., inverter subsystem 110). The inverter housing assembly (e.g., inverter housing assembly 120) may include one or more example embodiments described above and in the present disclosure. For example, the inverter housing assembly (e.g., inverter housing assembly 120) may include a plurality of side walls (e.g., top side wall 124a, bottom side wall 124b, front side wall 124c, rear side wall 124d, left side wall 124e, and/or right side wall 124f) and a main cavity (e.g., main cavity 122) formed by at least some of the plurality of side walls. The main cavity (e.g., main cavity 122) may be formed in such a way as to house the inverter subsystem (e.g., inverter subsystem 110) and form a ventilation channel (e.g., ventilation channel 125). The inverter housing assembly (e.g., inverter housing assembly 120) may further include an air inflow section (e.g., air inflow section 126). The air inflow section (e.g., air inflow section 126) may be for use in allowing an inflow of air into at least the ventilation channel (e.g., ventilation channel 125). The inverter housing assembly (e.g., inverter housing assembly 120) may further include an air outflow section (e.g., air outflow section 128). The air outflow section (e.g., air outflow section 128) may be for use in allowing an outflow of air from at least the ventilation channel (e.g., ventilation channel 125).

The provided power conversion system (e.g., power conversion system 100) may further include a processing subsystem (e.g., processing subsystem 130). The processing subsystem (e.g., processing subsystem 130) may include one or more example embodiments described above and in the present disclosure. For example, the processing subsystem (e.g., processing subsystem 130) may include a monitoring assembly (e.g., monitoring assembly 132) configurable to measure, obtain, and/or calculate one or more measurements. An example measurement may include a measurement of the input DC voltage provided by a power source (e.g., battery 102) at the input section (e.g., input section 112). The processing subsystem (e.g., processing subsystem 130) may further include a communication assembly (e.g., communication assembly 134) configurable to communicate with a device. Such communication may include communicating one or more measurements measured, obtained, and/or calculated by the monitoring assembly (e.g., monitoring assembly 132). Such device may include, but is not limited to, one or more example embodiments of the computing device (e.g., computing device 150), electrical device (e.g., electrical device 104), another power conversion system (e.g., power conversion system 100 and/or 100'), network (e.g., network 170), and/or database (e.g., database 160) described above and in the present disclosure.

The provided power conversion system (e.g., power conversion system 100) may then be applied to provide AC power to electrical devices. For example, the provided power conversion system (e.g., power conversion system 100) may be placed on or attached to a stationary object or platform/floor (e.g., as illustrated in FIGS. 3A-B). A power cable (e.g., cable 113) attached or attachable to the input section (e.g., input section 114) of the inverter subsystem (e.g., inverter subsystem 110) may be extended to a power source (e.g., battery 102) and attached to the respective terminals (e.g., positive, negative, and/or ground terminals) of the power source (e.g., battery 102). In situations where the power source is a battery installed in a vehicle (e.g., 12 VDC car battery), to prevent and/or enable avoiding of a "spark" or surge leakage of electricity upon connecting the power cable (e.g., cable 102, which may be a booster cable with alligator clips or other forms of connectors normally used to connect to car batteries), the inverter subsystem (e.g., inverter subsystem 110) may include the activation controller. For example, when the activation controller is actuated to the OFF position (or STANDBY position or any other equivalent or similar positions), the inverter subsystem (e.g., inverter subsystem 110) may be configurable to not perform any conversion of input DC voltage into output AC voltage (or vice versa). When the activation controller is actuated to the ON position (or any other equivalent or similar positions), the inverter subsystem (e.g., inverter subsystem 110) may be configurable to perform conversion of input DC voltage into output AC voltage (and/or vice versa). It is recognized in the present disclosure that such example embodiment of the activation controller may prevent and/or avoid the "spark" or surge leakage of electricity mentioned above from occurring. More specifically, when attaching the power cables (e.g., cable 113) to the respective terminals (e.g., positive, negative, and/or ground terminals) of the power source (e.g., car battery 102), the activation controller may be in the OFF position (or equivalent or similar position). Once the power cables (e.g., cable 113) are attached to the power source (e.g., car battery 102), the activation controller may then be actuated to be in the ON position (or equivalent or similar position), thereby allowing the inverter subsystem (e.g., inverter subsystem 110) to perform, among other things, the conversion of input DC voltage from the power source (e.g., car battery 102) to output AC voltage to electrical devices (e.g., electrical device 104). It is to be understood in the present disclosure that the activation controller may also be configurable to control operation and/or communication of one or more other elements of the power conversion system (e.g., power conversion system 100), and/or may also be controlled by one or more other elements of the power conversion system (e.g., power conversion system 100), the computing device (e.g., computing device 150), an electrical device (e.g., electrical device 104), another power conversion system (e.g., power conversion system 100'), network (e.g., network 170), etc. Other example embodiments of the activation controller are also contemplated without departing from the teachings of the present disclosure.

(2) Configuring a Device to Receive Information from a Power Conversion System (e.g., Action 304).

The method (e.g., method 300) may include configuring a device to receive information from a power conversion system (e.g., action 304). Such communication may include communicating one or more measurements measured, obtained, and/or calculated by the monitoring assembly (e.g., monitoring assembly 132). Such device may include, but is not limited to, one or more example embodiments of the computing device (e.g., computing device 150), electrical device (e.g., electrical device 104), another power conversion system (e.g., power conversion system 100 and/or 100'), network (e.g., network 170), and/or database (e.g., database 160) described above and in the present disclosure. An example of configuring a computing device (e.g., computing device 150) to receive information from the power conversion system (e.g., power conversion system 100) includes downloading a mobile application (e.g., a mobile application for iOS, Android, and/or other operating systems) onto the computing device (e.g., computing device 150), installing the mobile application on the computing device (e.g., computing device 150), and configuring the mobile application to enable the computing device (e.g., computing device 150) to communicate with the power conversion system (e.g., power conversion system 100). Such communication may include, but is not limited to, receiving information (e.g., notifications, alerts, scheduled updates, etc.) from the power conversion system (e.g., power conversion system 100) and/or sending information and/or commands to the power conversion system (e.g., power conversion system 100).

While various embodiments in accordance with the disclosed principles have been described above, it should be understood that they have been presented by way of example only, and are not limiting. Thus, the breadth and scope of the example embodiments described in the present disclosure should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages. For example, "assembly," "apparatus," "portion," "segment," "member," "body," "section," "subsystem," "subsection," "system," or other similar terms should generally be construed broadly to include one part or more than one part attached or connected together. Furthermore, "electrically connected," "electrical connection," "electrical communication," "electrically communicated," or other similar terms should generally be construed broadly to mean a wired, wireless, and/or other form of, as applicable, connection between two or more elements which enable an electric current to pass through, a voltage to be applied, and/or power to be supplied and/or transferred (each as applicable).

Also, as referred to herein, a processor, computing device, electrical device (when referring to a smart appliance or device), controller, monitoring assembly, communication assembly, indicator subsystem (and/or its measurement portion and/or display portion) may be any processor, computing device, and/or communication device, and may include a virtual machine, computer, node, instance, host, or machine in a networked computing environment. Also as referred to herein, a network or cloud may be or include a collection of machines connected by communication channels that facilitate communications between machines and allow for machines to share resources. Network may also refer to a communication medium between processes on the same machine. Also as referred to herein, a network element, node, or server may be a machine deployed to execute a program operating as a socket listener and may include software instances.

Database (or memory or storage) may comprise any collection and/or arrangement of volatile and/or non-volatile components suitable for storing data. For example, memory may comprise random access memory (RAM) devices, read-only memory (ROM) devices, magnetic or optical storage devices, solid state devices, and/or any other suitable data storage devices. In particular embodiments, database may represent, in part, computer-readable storage media on which computer instructions and/or logic are encoded. Database may represent any number of memory components within, local to, and/or accessible by a processor and/or computing device.

Various terms used herein have special meanings within the present technical field. Whether a particular term should be construed as such a "term of art" depends on the context in which that term is used. For example, "connect," "connected," "connecting," "connectable," "attach," "attached," "attaching," "attachable," "secure," "secured," "securing," "securable," "lock," "locked," "locking," "lockable," "anchor," "anchored," "anchoring," "anchorable," "install," "installed," "installing," "installable," "couple," "coupled," "coupling," "in communication with," "communicating with," "associated with," "associating with," or other similar terms should generally be construed broadly to include situations where attachments, connections, installations, and anchoring are direct between referenced elements or through one or more intermediaries between the referenced elements. As another example, "un-connect," "un-connected," "un-connecting," "un-connectable," "un-attach," "un-attached," "un-attaching," "un-attachable," "un-secure," "un-secured," "un-securing," "un-securable," "unlock," "unlocked," "unlocking," "unlockable," "uninstall," "uninstalled," "uninstalling," "uninstallable," or other similar terms should generally be construed broadly to include situations where separation, removal, and detaching are direct between referenced elements or from one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context. Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings and topic headings herein are provided for consistency with the suggestions under various patent regulations and practice, or otherwise to provide organizational cues. These headings shall not limit or characterize the embodiments set out in any claims that may issue from this disclosure. Specifically, a description of a technology in the "Background" is not to be construed as an admission that technology is prior art to any embodiments in this disclosure. Furthermore, any reference in this disclosure to "invention" in the singular should not be used to argue that there is only a single point of novelty in this disclosure. Multiple inventions may be set forth according to the limitations of the claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A portable power conversion system comprising:
   an inverter subsystem, the inverter subsystem having an input section for receiving an input DC voltage from an external power source and an output section for providing an output AC voltage based on the input DC voltage received by the input section;
   an inverter housing assembly, the inverter housing assembly including:
      a plurality of side walls and a main cavity formed by at least some of the plurality of side walls, the main cavity formed in such a way as to house the inverter subsystem and form a ventilation channel;

an air inflow section, the air inflow section for use in allowing an inflow of air into at least the ventilation channel;

an air outflow section, the air outflow section for use in allowing an outflow of air from at least the ventilation channel;

a processing subsystem, the processing subsystem including:

a monitoring assembly electrically connected to the inverter subsystem, the monitoring assembly configurable to perform one or more measurements, including at least a measurement of the input DC voltage at the input section; and a communication assembly in communication with the monitoring assembly, the communication assembly configurable to communicate one or more measurements performed by the monitoring assembly;

wherein the air inflow section comprises a concave semi-hemispherical structure protruding outwardly from an outwardly facing surface face of a vertical side wall having the air inflow section and covering an opening in the vertical side wall allowing the inflow of air into the ventilation channel and the air outflow section is a handle protruding outwardly from an outwardly facing surface face of a horizontal side wall having the air outflow section and covering an opening in the horizontal side wall allowing the outflow of air from the ventilation channel, the concave semi-hemispherical structure and the handle preventing a downfall of a liquid from flowing onto the inverter subsystem.

2. The portable power conversion system of claim 1, further comprising a second air inflow section, the second air inflow section for use in allowing an inflow of air into at least the ventilation channel;

wherein a first side wall further comprises a first structure protruding outwardly from an outwardly facing surface of the first side wall, the first structure forming at least a part of the air inflow section; and wherein a second side wall opposite to the first side wall further comprises a second structure protruding outwardly from an outwardly facing surface of the second side wall, the second structure forming at least a part of the second air inflow section.

3. The portable power conversion system of claim 1, wherein the a side wall further comprises a structure protruding outwardly from an outwardly facing surface of the side wall, the structure having a cavity;

wherein the air outflow section is provided on at least a portion of the structure; and wherein at least one portion of the cavity of the structure connects to the ventilation channel and at least another portion of the cavity of the structure connects to the air outflow section.

4. The portable power conversion system of claim 1, wherein the air inflow section and the air outflow section are operable to cooperate together to control an operating temperature of the inverter subsystem by allowing a passing of air through the ventilation channel.

5. The portable power conversion system of claim 1, further comprising at least one power cable, each of the at least one power cable electrically connectable at a first end to the input section, and each of the at least one power cable electrically connectable at a second end to an alternator installed in a vehicle;

wherein the input DC voltage is provided to the input section by the alternator.

6. The portable power conversion system of claim 1, wherein the monitoring assembly is further configurable to perform a measurement of an ambient temperature and/or an output AC voltage at the output section.

7. The portable power conversion system of claim 1, wherein one or more of the following apply:

the communication assembly wirelessly communicates the one or more measurements performed by the monitoring assembly to a computing device;

the communications between the communication assembly and the computing device are secure and encrypted communications;

the communication assembly is configurable to establish a wireless connection with the computing device; and/or a connection between the communication assembly and the computing device is a secure and encrypted connection.

8. The portable power conversion system of claim 1, wherein the processing subsystem further comprises a processor, the processor in communication with the monitoring assembly and communication assembly;

wherein the processor is configurable to determine, based on one or more measurements performed by the monitoring assembly, if a DC power source providing the input DC voltage reaches a threshold level;

wherein the processor is further configurable to communicate, to a computing device via the communication assembly, the input DC voltage.

9. A portable power conversion system comprising:

an inverter subsystem, the inverter subsystem having an input section for receiving an input DC voltage from an external power source and an output section for providing an output AC voltage based on the input DC voltage received by the input section; and an inverter housing assembly, the inverter housing assembly including:

a plurality of side walls and a main cavity formed by at least some of the plurality of side walls, the main cavity formed in such a way as to house the inverter subsystem and form a ventilation channel;

an air inflow section, the air inflow section for use in allowing an inflow of air into at least the ventilation channel; and an air outflow section, the air outflow section for use in allowing an outflow of air from at least the ventilation channel; and wherein the air inflow section comprises a concave semi-hemispherical structure protruding outwardly from an outwardly facing surface face of a vertical side wall having the air inflow section and covering an opening in the vertical side wall allowing the inflow of air into the ventilation channel and the air outflow section is a handle protruding outwardly from an outwardly facing surface face of a horizontal side wall having the air outflow section and covering an opening in the horizontal side wall allowing the outflow of air from the ventilation channel, the concave semi-hemispherical structure and the handle preventing a downfall of a liquid from flowing onto the inverter subsystem.

10. The portable power conversion system of claim 9, further comprising a second air inflow section, the second air inflow section for use in allowing an inflow of air into at least the ventilation channel;

wherein a first side wall further comprises a first structure protruding outwardly from an outwardly facing surface of the first side wall, the first structure forming at least a part of the air inflow section; and wherein a second side wall opposite to the first side wall further comprises a second structure protruding outwardly from an outwardly facing surface of the second side wall, the second structure forming at least a part of the second air inflow section.

11. The portable power conversion system of claim 9, wherein the a side wall further comprises a structure protruding outwardly from an outwardly facing surface of the side wall, the structure having a cavity;

wherein the air outflow section is provided on at least a portion of the structure; and wherein at least one portion of the cavity of the structure connects to the ventilation channel and at least another portion of the cavity of the structure connects to the air outflow section.

12. The portable power conversion system of claim 9, wherein the air inflow section and the air outflow section are operable to cooperate together to control an operating temperature of the inverter subsystem by allowing a passing of air through the main cavity.

13. The portable power conversion system of claim 9, further comprising at least one power cable, each of the at least one power cable electrically connectable at a first end to the input section, and each of the at least one power cable electrically connectable at a second end to an alternator installed in a vehicle;

wherein the input DC voltage is provided to the input section by the alternator installed in the vehicle.

14. The portable power conversion system of claim 9, further comprising a processor;

wherein the processor is configurable to determine if a DC power source providing the input DC voltage reaches a threshold level;

wherein the processor is further configurable to communicate, to a computing device, the input DC voltage.

15. A method of forming a portable power conversion system, the portable power conversion system operable to provide and remotely monitor the providing of emergency AC power to one or more AC powered electrical devices via an alternator installed in a vehicle, the method comprising:

providing an inverter, the inverter including an input section for receiving an input DC voltage from an external power source and an output section for providing an output AC voltage based on the input DC voltage received by the input section;

forming an inverter housing assembly, the inverter housing assembly formed in such a way as to include (i) a plurality of side walls and a main cavity formed by at least some of the plurality of side walls, the main cavity formed in such a way as to enable the main cavity to house the inverter and form a ventilation channel, (ii) an air inflow section, the air inflow section for use in allowing an inflow of air into at least the ventilation channel, and (iii) an air outflow section, the air outflow section for use in allowing an outflow of air from at least the ventilation channel, wherein the air inflow section comprises a concave semi-hemispherical structure protruding outwardly from an outwardly facing surface face of a vertical side wall having the air inflow section and covering an opening in the vertical side wall allowing the inflow of air into the ventilation channel and the air outflow section is a handle protruding outwardly from an outwardly facing surface face of a horizontal side wall having the air outflow section and covering an opening in the horizontal side wall allowing the outflow of air from the ventilation channel, the concave semi-hemispherical structure and the handle preventing a downfall of a liquid from flowing onto the inverter subsystem;

securing the inverter in the main cavity of the inverter housing assembly;

providing a monitoring assembly;

electrically connecting the monitoring assembly to the inverter;

configuring the monitoring assembly to perform one or more measurements, including at least a measurement of the input DC voltage at the input section;

providing a communication assembly;

forming a communication channel between the communication assembly and the monitoring assembly so as to receive, at the communication assembly from the monitoring assembly, one or more measurements performed by the monitoring assembly; and configuring the communication assembly to communicate, to a computing device having an established communication channel with the communication assembly, one or more measurements performed by the monitoring assembly.

16. A method of providing and remotely monitoring via a computing device the providing of emergency AC power to one or more AC powered electrical devices via an alternator installed in a vehicle, the method comprising:

providing a portable power conversion system, the portable power conversion system including an inverter subsystem, an inverter housing assembly for housing the inverter subsystem, and a processing subsystem; wherein the inverter subsystem includes an input section for receiving an input DC voltage from the alternator of an automobile and an output section for providing an output AC voltage to the one or more AC powered electrical devices based on the input DC voltage received by the input section; wherein the inverter housing assembly includes (i) a plurality of side walls and a main cavity formed by at least some of the plurality of side walls, the main cavity formed in such a way as to house the inverter subsystem and form a ventilation channel, (ii) an air inflow section, the air inflow section for use in allowing an inflow of air into at least the ventilation channel, and (iii) an air outflow section, the air outflow section for use in allowing an outflow of air from at least the ventilation channel; and wherein the air inflow section comprises a concave semi-hemispherical structure protruding outwardly from an outwardly facing surface face of a vertical side wall having the air inflow section and covering an opening in the vertical side wall allowing the inflow of air into the ventilation channel and the air outflow section is a handle protruding outwardly from an outwardly facing surface face of a horizontal side wall having the air outflow section and covering an opening in the horizontal side wall allowing the outflow of air from the ventilation channel, the concave semi-hemispherical structure and the handle preventing a downfall of a liquid from flowing onto the inverter subsystem and wherein the processing subsystem includes a monitoring assembly configurable to perform one or more measurements, including at least a measurement of the input DC voltage provided by the alternator at the input section, and a communication assembly configurable to communicate, to the computing device, one or more measurements performed by the monitoring assembly; and configuring the computing device to receive, from the communication assembly, information including one or more measurements performed by the monitoring assembly.

\* \* \* \* \*